United States Patent
Anderson et al.

(10) Patent No.: US 7,811,875 B2
(45) Date of Patent: Oct. 12, 2010

(54) DUAL WORK-FUNCTION SINGLE GATE STACK

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/175,528

(22) Filed: Jul. 18, 2008

(65) Prior Publication Data

US 2008/0299711 A1 Dec. 4, 2008

Related U.S. Application Data

(62) Division of application No. 11/548,020, filed on Oct. 10, 2006, now Pat. No. 7,449,735.

(51) Int. Cl.
*H01L 21/8238* (2006.01)

(52) U.S. Cl. .................... 438/199; 438/197; 438/692; 438/510; 257/E21.32; 257/E21.051; 257/E21.421; 257/E21.561; 257/E21.632

(58) Field of Classification Search ................ 438/197, 438/199, 311, 227.297, 267, 510, 524, 752, 438/753, 682, 684; 257/E21.32, 51, 421, 257/561, 632
See application file for complete search history.

(56) References Cited

U.S. PATENT DOCUMENTS

| | | | |
|---|---|---|---|
| 5,952,701 A | 9/1999 | Bulucca et al. | |
| 6,066,533 A | 5/2000 | Yu | |
| 6,166,417 A | 12/2000 | Bai et al. | |
| 6,873,020 B2 | 3/2005 | Misra et al. | |
| 6,936,508 B2 | 8/2005 | Visokay et al. | |
| 7,005,716 B2 | 2/2006 | Lin et al. | |
| 7,022,559 B2* | 4/2006 | Barnak et al. | 438/153 |
| 7,449,735 B2* | 11/2008 | Anderson et al. | 257/288 |
| 2003/0178689 A1 | 9/2003 | Maszara et al. | |
| 2003/0180994 A1 | 9/2003 | Polishchuk et al. | |
| 2004/0080001 A1 | 4/2004 | Takeuchi | |
| 2004/0183143 A1 | 9/2004 | Matsuo | |
| 2005/0006711 A1 | 1/2005 | Rotondaro et al. | |
| 2005/0070062 A1 | 3/2005 | Visokay et al. | |
| 2005/0258500 A1 | 11/2005 | Colombo et al. | |
| 2006/0017122 A1 | 1/2006 | Chau et al. | |

* cited by examiner

*Primary Examiner*—David Nhu
(74) *Attorney, Agent, or Firm*—Gibb I.P. Law Firm, LLC

(57) ABSTRACT

Disclosed is a complementary CMOS device having a first FET with sidewall channels and a second FET with a planar channel. The first FET can be a p-FET and the second FET can be an n-FET or vice versa. The conductor used to form the gate electrodes of the different type FETs is different and is pre-selected to optimize performance. For example, a p-FET gate electrode material can have a work function near the valence band and an n-FET gate electrode material can have a work function near the conduction band. The first gate electrodes of the first FET are located adjacent to the sidewall channels and the second gate electrode of the second FET is located above the planar channel. However, the device structure is unique in that the second gate electrode extends laterally above the first FET and is electrically coupled to the first gate electrodes.

15 Claims, 18 Drawing Sheets

DUAL WORK-FUNCTION SINGLE GATE STACK

CROSS-REFERENCE TO RELATED APPLICATIONS

This application is a divisional of U.S. application Ser. No. 11/548,020 filed Oct. 10, 2006, U.S. Pat. No. 7,449,735 which is fully incorporated herein by reference.

BACKGROUND

1. Field of the Invention

The embodiments of the invention generally relate to dual work-function gate electrodes and, more particularly, to dual work-function gate electrodes on dual-plane high-mobility complementary metal oxide semiconductor devices.

2. Description of the Related Art

Recently, to enhance carrier mobility and, thus, performance of complementary metal oxide semiconductor (CMOS) devices, p-type field effect transistors (p-FETs) and n-type field effect transistors (n-FETs) have been formed on different planes within the same semiconductor layer. That is, to enhance performance CMOS devices have been formed that comprise different type devices: one with sidewall channels and one with a planar channel. Specifically, such a CMOS device can comprise a non-planar first type transistor (e.g., a p-FET) with a channel region that is perpendicular relative to the substrate (i.e., sidewall channels) so that it has a first orientation (e.g., a 110 orientation that is optimal for mobility of first type carriers (e.g., holes)). Gates are formed on the opposing sidewalls and, optionally, on the top and bottom surfaces of the channel region. Additionally, the CMOS device can comprise a planar second type transistor (e.g., an n-FET) with a channel region that is parallel relative to the substrate so that it has a second orientation (e.g., 100 orientation that is optimal for mobility of second type carriers (e.g., electrons)) and a single gate above the channel region and, optionally, a back gate below the channel region.

Performance of CMOS devices has also been enhanced by incorporating dual work-function gate electrodes into the CMOS device structure. That is, CMOS devices have been formed that comprise gate electrodes that have different materials selected to optimize p-FET performance and n-FET performance, respectively. Specifically, gate electrodes can be formed from polysilicon and doped with different type dopants (e.g., n-type or p-type dopants) to different degrees, depending upon the type of field effect transistor being formed. Alternatively, gate electrodes can be formed from different metal materials, depending upon the type of field effect transistor being formed. For example, it is desirable for the work function of gate electrodes on n-FETs to be close to the conduction band in order to reduce the threshold voltage of such transistors and, thereby, optimize n-FET drive current. This can be accomplished by doping a polysilicon gate electrode of an n-FET with a high concentration of an n-type dopant (e.g., phosphorous (P), arsenic (As) or antimony (Sb)). This can also be accomplished by forming the gate electrode with a conduction band metal (e.g., aluminum (Al)). Contrarily, it is desirable for the work function of gate electrodes on p-FETs to be close to the valence band in order to reduce the threshold voltage of such transistors and, thereby, optimize p-FET drive current. This can be accomplished by doping a polysilicon gate electrode of a p-FET with a high concentration of a p-type dopant (e.g., boron (B)). This can also be accomplished by forming the gate electrode with a valence band metal (e.g., magnesium (Mg)).

While prior art CMOS devices have incorporated dual work-function gate electrodes as well as planar and non-planar FETs, the methods used to form such devices are costly, requiring a number of additional processing steps, including multiple gate masks. Therefore, there is a need in the art for an improved simple dual-plane high-mobility CMOS device structure and method of forming the structure that requires only a single gate mask.

SUMMARY

In view of the foregoing, disclosed herein are embodiments of a dual-plane high-mobility complementary metal oxide semiconductor (CMOS) device that has a first field effect transistor (FET) with sidewall channels and a second opposite type FET with a planar channel. Specifically, the first FET can be a p-type FET (i.e., a p-FET) and the second FET can be an n-type FET (i.e., an n-FET) or vice versa. The conductive material used to form the gate electrodes of each of the different type FETs is different and is pre-selected to optimize FET performance. For example, the gate electrode material for a p-FET is pre-selected to have a work function near the valence band and the gate electrode material for an n-FET is pre-selected to have a work function near the conduction band. The first gate electrodes are located adjacent to the sidewall channels of the first FET and the second gate electrode is located above the planar channel of the second FET. However, the device structure is unique in that the second gate electrode extends laterally above the first FET and is electrically coupled to the first gate electrodes. Also disclosed are embodiments of an associated method of forming the CMOS device.

More particularly, disclosed herein are embodiments of a complementary metal oxide semiconductor (CMOS) device. Each embodiment of the CMOS device comprises a first FET with sidewall channels and a second opposite type FET with a planar channel. Thus, the first FET can comprise an n-FET with sidewall channels and the second FET can comprise a p-FET with a planar channel. Alternatively, the first FET can comprise a p-FET with sidewall channels and the second FET can comprise an n-FET with a planar channel.

In each embodiment of the CMOS device, the first FET comprises one or more first semiconductor bodies having an optional cap layer on the top surface. The first FET further comprises first gate electrodes adjacent to the sidewalls of the one or more first semiconductor bodies and, particularly, adjacent to the sidewall channels. The second FET comprises a second semiconductor body and a second gate electrode adjacent to its top surface. Specifically, the second gate electrode is positioned adjacent to the planar channel in the second semiconductor body and extends laterally above the first FET. The second gate electrode is further electrically coupled to the first gate electrodes and can be electrically isolated from the top surface of the one or more first semiconductor bodies by the optional cap layer. Optionally, the second FET can comprise a back gate electrode below the planar channel.

Additionally, in each embodiment of the CMOS device, the conductive material that is used for the gate electrodes of the p-FET and the n-FET is different and is pre-selected to optimize FET performance. Specifically, the gate electrode material for a p-FET is pre-selected to have a work function near the valence band. For example, the gate electrode material for the p-FET can comprise a valence band metal or a p-doped polysilicon. Whereas, the gate electrode material for an n-FET is pre-selected to have a work function near the conduction band. For example, the gate electrode material for the n-FET can comprise a conduction band metal or an n-doped polysilicon. Furthermore, in order to ensure electrical conductivity between the first and second gate electrodes despite any pn-junction diode that may be formed at the interface between the first and second gate electrodes, the top surface of the first gate electrodes can further comprise a metallic conductor, such as a metal, a metal silicide, titanium nitride, etc.

Distinctions between the various embodiments of the CMOS device relate to the location of the first gate electrode (e.g., between multiple first semiconductor bodies and relative to the second semiconductor body) as well as the isolation structure that isolates the second semiconductor body from the first gate electrodes.

Also, disclosed are embodiments of a method of forming the complementary metal oxide semiconductor (CMOS) device, described above. Specifically, in each embodiment of the method a wafer is provided that comprises a substrate, an isolation layer on the substrate, a semiconductor layer on the isolation layer, and a cap layer on the semiconductor layer. A pattern is etched into the wafer through the cap and semiconductor layers in order to form one or more first semiconductor bodies for a first field effect transistor (FET) with sidewall channels and a second semiconductor body for a second opposite type FET with a planar channel.

Regardless of the embodiment of the method used to form the CMOS device, the first FET can be formed as an n-FET and the second FET can be formed as a p-FET. Alternatively, the first FET can be formed as a p-FET and the second FET can be formed as an n-FET. Selection of which FET comprise the p-FET and with comprises the n-FET depends upon the orientation of the semiconductor layer so as to optimize carrier mobility.

In each embodiment of the method, a first gate dielectric layer and first gate electrodes are formed adjacent to the first semiconductor body sidewalls. The first gate electrodes are formed with a first conductive material (see detailed discussion below regarding pre-selection of gate electrode materials). The various method embodiments are distinguished by the techniques used to form the first gate electrodes and, thus, the resulting structure that is formed. Three techniques are disclosed.

One technique comprises depositing a dielectric layer over the first and second semiconductor bodies and planarizing the dielectric layer to expose the cap layer on each of the semiconductor bodies. A recess is formed in the dielectric layer down to the isolation layer such that the sidewalls of each of the one or more first semiconductor bodies are exposed in a center region. The first gate dielectric is formed on the exposed sidewalls and the first conductive material is deposited, thereby filling in the recess. The first conductive material is then planarized to again expose the cap layer on each of the semiconductor bodies, thereby forming the first gate electrodes. Thus, the first gate electrodes are formed adjacent to the first semiconductor bodies and not the second semiconductor body. Additionally, the gate electrodes between multiple first semiconductor bodies are shared.

Another technique for forming the first gate electrodes comprises forming a first gate dielectric layer and sidewall spacers with the first conductive material adjacent to the sidewalls of the one or more first semiconductor bodies in a center region. Following sidewall spacer formation, a dielectric layer is deposited, thereby filling in any spaces between the first and second semiconductor bodies and creating isolation structures. Thus, the first gate electrodes are formed adjacent to the first semiconductor bodies and not the second semiconductor body. Additionally, the gate electrodes between multiple first semiconductor bodies are electrically isolated from each other.

Yet another technique for forming the first gate electrodes comprises depositing a dielectric layer over the first and second semiconductor bodies and planarizing the dielectric layer to expose the cap layer on each of the semiconductor bodies. A recess is formed in the dielectric layer down to the isolation layer such that the sidewalls all of the semiconductor bodies are exposed in a center region. A thin dielectric material (i.e., a gate dielectric) is formed on the exposed sidewalls of the first semiconductor bodies and a thick dielectric material is formed on the exposed sidewalls of the second semiconductor body. Then, a conductive material is deposited, thereby filling in the recess. The first conductive material is then planarized to again expose the cap layer on each of the semiconductor bodies, thereby forming the first gate electrodes. Thus, the first gate electrodes are formed adjacent to the both the first semiconductor bodies and the second semiconductor body. Additionally, the gate electrodes between multiple first semiconductor bodies are shared.

During the first gate electrode formation process, the cap layer is selectively removed from the entire second semiconductor body and the end regions of the one more first semiconductor bodies. Furthermore, a metal silicidation process can be performed in order to form metal silicide regions in the top surface of the first gate electrodes.

Following first gate electrode formation, a second gate dielectric layer is formed on the exposed top surface of the second semiconductor body and then, a second gate electrode is formed. Specifically, the second gate electrode is formed on the second gate dielectric layer adjacent to the top surface of the second semiconductor body. The second gate electrode is further formed such that it extends laterally above the first FET (i.e., above the one or more first semiconductor bodies and the first gate electrodes), such that it is electrically coupled to (i.e., contacts) the first gate electrodes and, optionally, such that is electrically isolated from the one or more first semiconductor bodies by a cap layer on top of each of the first semiconductor bodies.

The first conductive material that is used to form the one or more first gate electrodes and the second conductive material that is used to form the second gate electrode are different and are pre-selected prior to gate electrode formation. Specifically, the conductive material used to form the first and second gate electrodes will vary depending upon which of the first and second FETs is a p-FET and which is an n-FET. Specifically, a p-FET can be formed with a gate electrode material that is pre-selected to have a work function near the valence band. For example, the p-FET gate electrode material can comprise a valence band metal (e.g., magnesium (Mg)) or polysilicon heavily doped with a p-type dopant (e.g., boron (B)). Whereas, an n-FET can be formed with a gate electrode material that is pre-selected to have a work function near the conduction band. For example, the n-FET gate electrode material can comprise a conduction band metal (e.g., aluminum (Al)) or polysilicon heavily doped with an n-type dopant (e.g., phosphorus (P), antimony (Sb) or arsenic (As)). However, those skilled in the art will recognize that, unless a metallic conductor such as a metal silicide region is formed on the top surfaces of the one or more first semiconductor bodies during previous processing, a pnjunction diode will be formed p-doped and n-doped polysilicon both used for the different gate electrode materials. The metal silicide forms a bridge between the second gate electrode and the first gate electrode ensuring that current is allowed to flow easily between the two.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
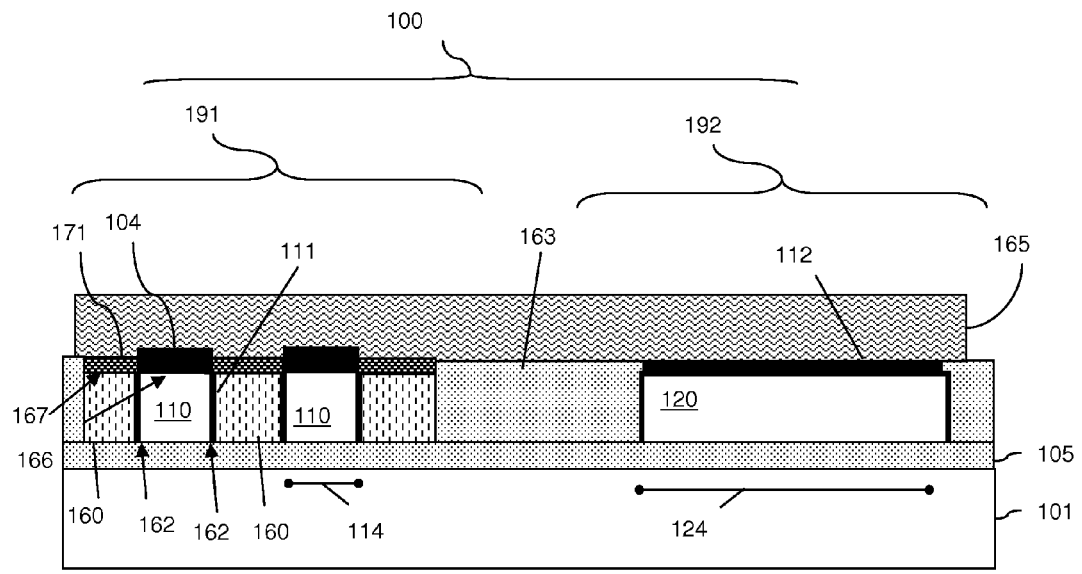
FIG. 1 is a schematic diagram illustrating a cross-section view of an embodiment of the structure 100 of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, while prior art complementary metal oxide semiconductor (CMOS) devices have incorporated dual work-function gate electrodes as well as planar and non-planar field effect transistors (FETs), the methods used to form such devices are costly, requiring a number of additional processing steps, including multiple gate masks. Therefore, there is a need in the art for an improved simple dual-plane high-mobility CMOS device structure and method of forming the structure that requires only a single gate mask.

In view of the foregoing disclosed herein are embodiments of a dual-plane high-mobility complementary metal oxide semiconductor (CMOS) device that has a first FET with sidewall channels and a second opposite type FET with a planar channel. Specifically, the first FET can be a p-type FET (i.e., a p-FET) and the second FET can be an n-type FET (i.e., an n-FET) or vice versa. Selection of which FET comprise the p-FET and with comprises the n-FET depends upon the orientation of the semiconductor so as to optimize carrier mobility. The conductive material used to form the gate electrodes of each of the different type FETs is different and is pre-selected to optimize FET performance. For example, the gate electrode material for a p-FET is pre-selected to have a work function near the valence band and the gate electrode material for an n-FET is pre-selected to have a work function near the conduction band. The first gate electrodes are located adjacent to the sidewall channels of the first FET and the second gate electrode is located above the planar channel of the second FET. However, the device structure is unique in that the second gate electrode extends laterally above the first FET and is electrically coupled to the first gate electrodes. Also disclosed are embodiments of an associated method of forming the CMOS device.

Figure 2:
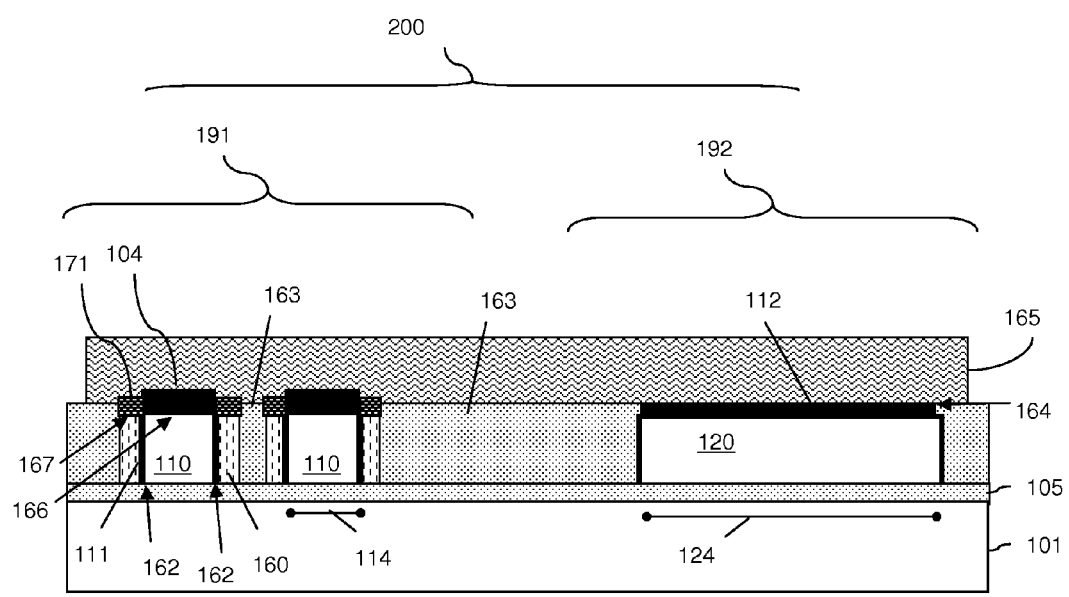
FIG. 2 is a schematic diagram illustrating a cross-section view of another embodiment of the structure 200 of the invention.
Figure 3:
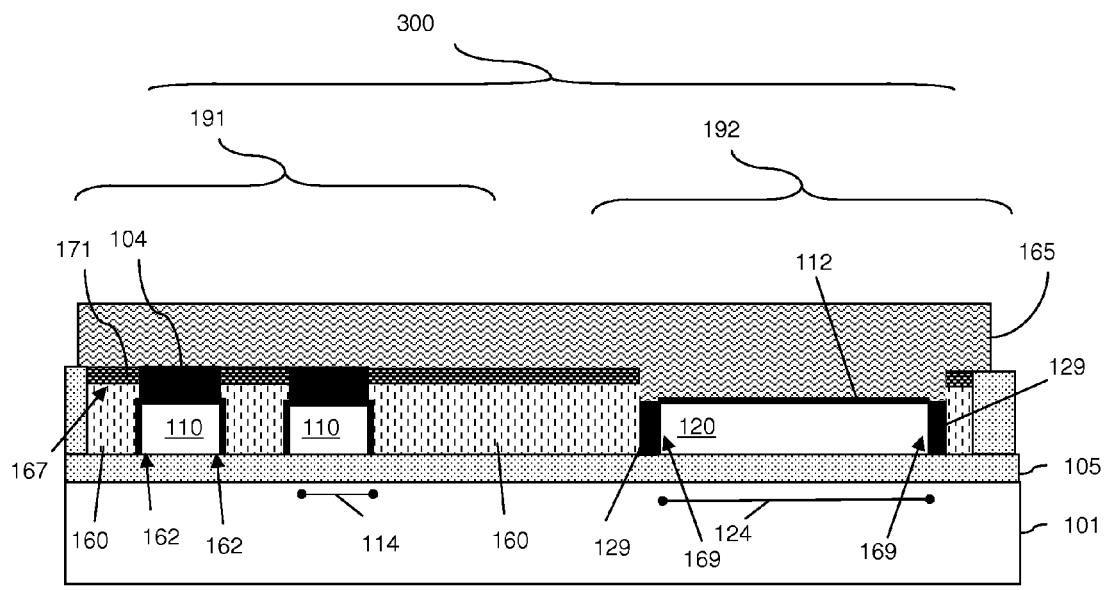
FIG. 3 is a schematic diagram illustrating a cross-section view of another embodiment of the structure 300 of the invention.
Figure 4:
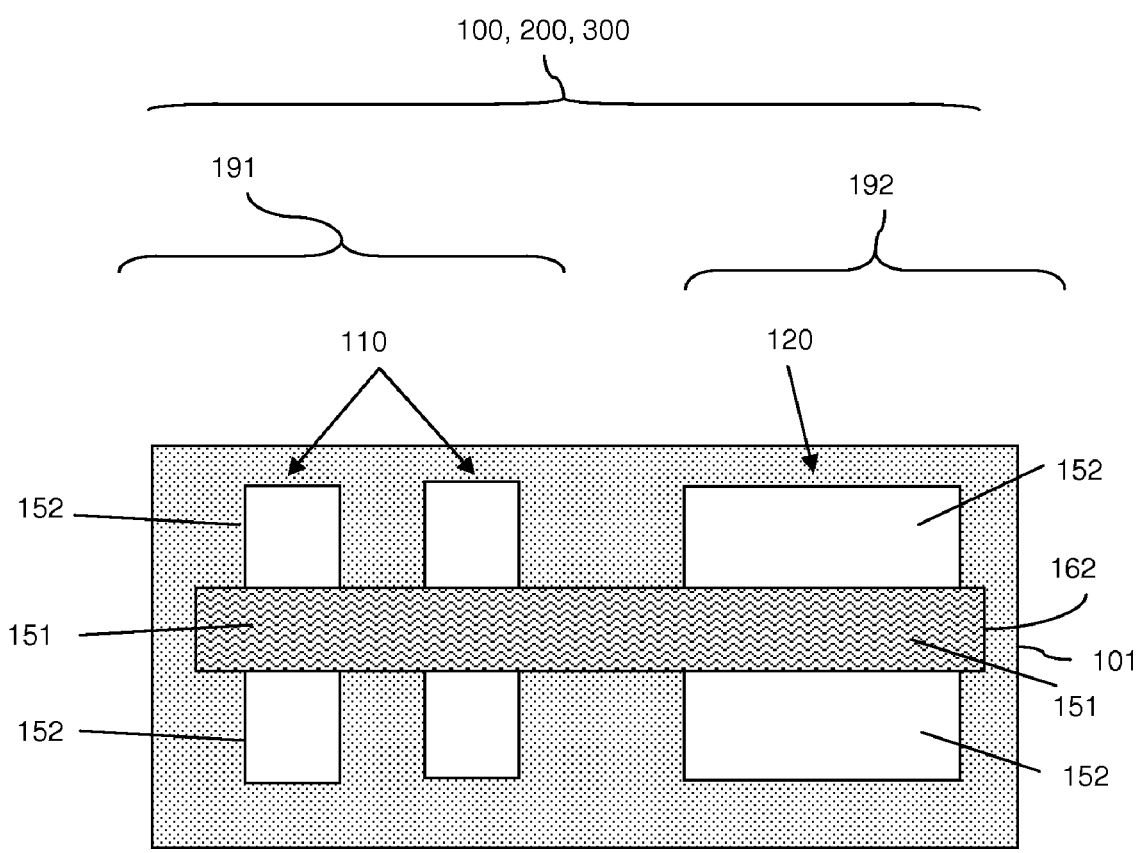
FIG. 4 is a schematic diagram illustrating a top view of structure 100 of FIG. 1, of structure 200 of FIG. 2 or of structure 300 of FIG. 3.

More particularly, disclosed herein are embodiments of a complementary metal oxide semiconductor (CMOS) device 100, 200, and 300 illustrated in FIGS. 1, 2 and 3, respectively. FIG. 4 provides a top view illustration of the device 100, 200 and 300. Distinctions between the various embodiments 100, 200, 300 of the CMOS device relate to the location of the first gate electrode (e.g., between multiple first semiconductor bodies and relative to the second semiconductor body) as well as the isolation structure that isolates the second semiconductor body from the first gate electrodes.

Referring to FIGS. 1-4 in combination, each embodiment 100, 200, 300 of the CMOS device can comprise, for example, an inverter with the drain of an n-FET coupled to the drain of a p-FET and with the gates connected to each other. The CMOS device can be formed on a bulk silicon or silicon-on-insulator wafer. An isolation region 105 (e.g., a doped silicon layer, a silicon germanium layer, a buried oxide layer and/or a combination of isolation layers and structures) electrically isolates the CMOS device from the wafer substrate 101.

Specifically, each embodiment 100, 200, 300 of the CMOS device comprises a first FET 191 with sidewall channels and a second, opposite type, FET 192 with a planar channel. Thus, the first FET 191 can comprise an n-type field effect transistor and the second FET 192 can comprise a p-type field effect transistor. Alternatively, the first FET 191 can comprise a p-type field effect transistor and the second FET 192 can comprise an n-type field effect transistor. Selection of which FET comprises the p-FET and which comprises the n-FET depends upon the orientation of the semiconductor on the wafer so as to optimize carrier mobility.

The first FET 191 comprises one or more first semiconductor bodies 110 (e.g., semiconductor bodies patterned and etched from a semiconductor layer, such a silicon (Si) layer). Each first semiconductor body 110 comprises a center (channel) region 151 and end (source/drain) regions 152. Those skilled in the art will recognize that while each first semiconductor body 110 is illustrated as having the same width in both the center (channel) region 151 and the end (source/drain) regions 152, the end regions 152 may be formed wider than the center region 151 in order to enhance FET performance. An optional cap layer 104 may be positioned on the top surface 166 of each first semiconductor body 110 above the center channel region 151.

The first FET 191 further comprises first gate electrodes 160 (i.e., sidewall channel gate electrodes) adjacent to the sidewalls 162 and, particularly, on a first gate dielectric 111 adjacent to the sidewall channels in the center region 151 of each first semiconductor body 110.

The second FET 192 comprises a second semiconductor body 120 (e.g., a second semiconductor body that is simultaneously patterned and etched from the same semiconductor layer as the one or more first semiconductor bodies 110). As with each first semiconductor body 110, the second semiconductor body will have a center (channel) region 151 and end (source/drain) regions 152. Given that the one or more first semiconductor bodies 110 are incorporated into a first FET 191 with sidewall channels and the second semiconductor body 120 is incorporated into a second FET 192 with a planar channel, the channel width 114 of each first semiconductor body 110 will generally be less than the channel width 124 of the second semiconductor body 120.

The second FET 192 will further comprise a second gate electrode 165 (i.e., a planar channel gate electrode) above its top surface 164 and, particularly, on a second gate dielectric layer 112 adjacent to the planar channel in the center region 151 of the second semiconductor body 120. Additionally, the second gate electrode 165 (i.e., the planar channel gate electrode) extends laterally above the first FET 191 (i.e., above the top surfaces 166, 167 of the one or more first semiconductor bodies 110 and the first gate electrodes 160). The second gate electrode 165 is further electrically coupled to (i.e., contacts) the first gate electrodes 160 (i.e., the sidewall channel gate electrodes) and can be electrically isolated from the top surface 166 of the one or more first semiconductor bodies 110 by the optional cap layer 104. It is anticipated that the second FET 192 may also comprise a back gate electrode (not shown) below the second semiconductor body 120 so as to selectively adjust the threshold voltage of the second FET 192.

As mentioned above, the distinctions between the various embodiments 100, 200, 300 of the CMOS device relate to the location of the first gate electrode (e.g., between multiple first semiconductor bodies and relative to the second semiconductor body) as well as the isolation structure that isolates the second semiconductor body from the first gate electrodes.

Specifically, as illustrated in FIGS. 1 and 2, embodiments 100, 200 of the CMOS device can comprise a trench isolation region 163 that isolates the first FET 191 and, particularly, the first gate electrode 160 of the first FET 191 from the second FET 192. Alternatively, as illustrated in FIG. 3, the embodiment 300 can comprise first gate electrodes 160 that are located adjacent to the sidewalls of both the first semiconductor bodies 110 of the first transistor 191 and the second semiconductor body 120 of the second transistor 192. Optionally, thick sidewall spacers 129 on the sidewalls 169 of the second semiconductor body 120 can isolate the second semiconductor body 120 from the first gate electrode 160. These sidewall spacers 129 can comprise, for example, thick nitride or oxide sidewall spacers.

Furthermore, if the first FET 191 comprises a plurality of first semiconductor bodies 110, then one shared first gate electrode 160 can extend between each adjacent first semiconductor body (e.g., see embodiments 100 of FIGS. 1 and 300 of FIG. 3). Alternatively, as illustrated in embodiment 200 of FIG. 2, the first gate electrodes 160 can be formed as conductive sidewall spacers adjacent to the first semiconductor bodies 110 and can be electrically isolated from each other by additional isolation structures 163.

While the embodiments 100, 200, 300 described and illustrated in FIGS. 1, 2 and 3, respectively, provide an optional cap layer 104 on the top surface 166 of the central (channel) region 151 of the one or more first semiconductor bodies 110, it is anticipated that the cap layer 104 may be replaced with a thin gate dielectric layer so that the first FET 191 can comprise a trigate FET with the second gate electrode 165 of the second FET 192 simultaneously acting as one of the gate electrodes for the first FET 191. Those skilled in the art will recognize that the functionality of such a FET structure will depend upon the work-function of the conductive material used to form the second gate electrode and on the crystalline orientation of the first semiconductor bodies.

In each embodiment 100, 200, 300 of the CMOS device the conductive material that is used for the gate electrodes 160 and 165 of the first and second FETs 191, 192 is different and is pre-selected to optimize FET performance. Specifically, the gate electrode material for a p-FET, regardless of whether the p-FET has sidewall channels or a planar channel, is pre-selected to have a work function near the valence band. For example, the gate electrode material for the p-FET can comprise a valence band metal (e.g., magnesium (Mg)) or polysilicon heavily doped with a p-type dopant (e.g., boron (B)). Whereas, the gate electrode material for an n-FET, whether the n-FET has sidewall channels or a planar channel, is pre-selected to have a work function near the conduction band. For example, the gate electrode material for the n-FET can comprise a conduction band metal (e.g., aluminum (Al)) or polysilicon heavily doped with an n-type dopant (e.g., phosphorus (P), antimony (Sb) or arsenic (As)). Furthermore, to ensure electrical conductivity between the first 160 and second 165 gate electrodes despite any pn-junction diode that may be formed (e.g., if the gate electrode material for the p-FET comprises a p-doped polysilicon and the gate electrode material for the n-FET comprise an n-doped polysilicon), the top surface 167 of each first gate electrode 110 (i.e., the top surface of the sidewall channel gate electrodes) can comprise a metallic conductor, such as a metal, a metal silicide 171 (e.g., a nickel, cobalt, or titanium silicide), titanium nitride, etc.

Figure 5:
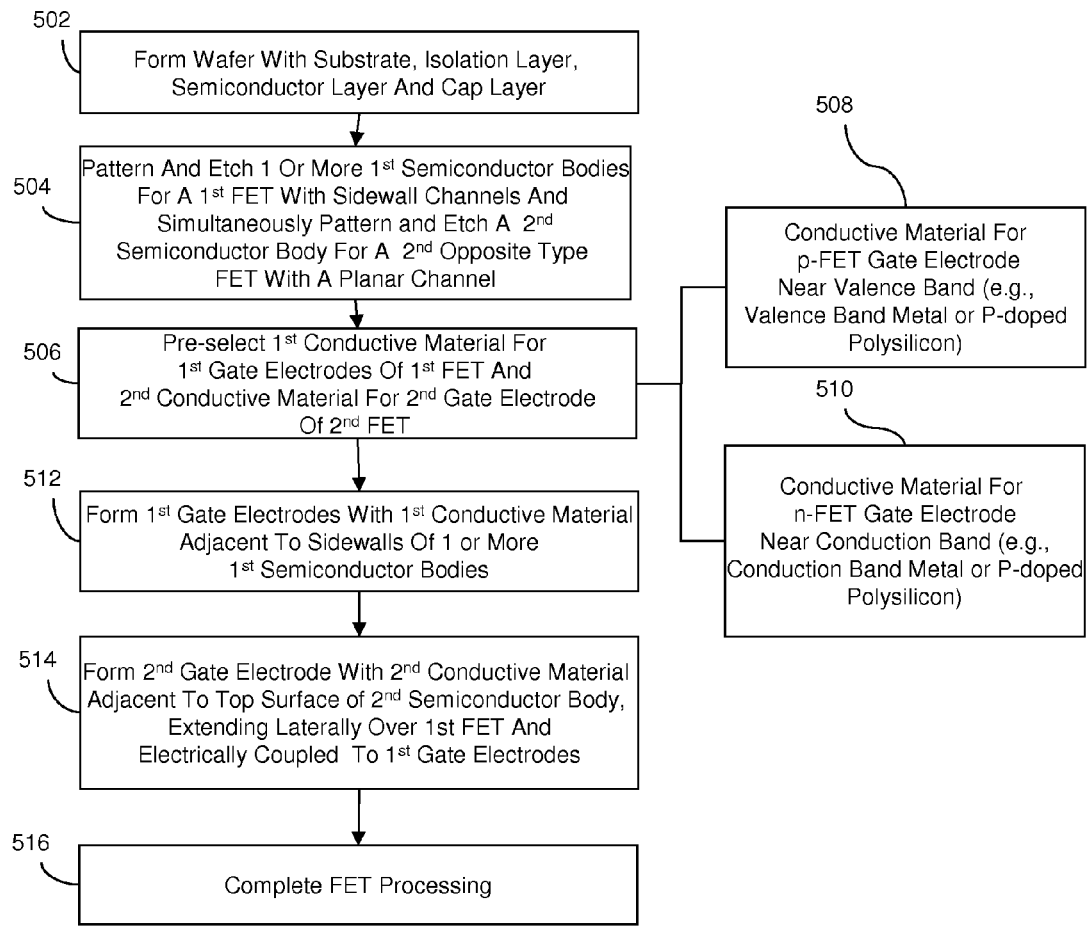
FIG. 5 is a flow diagram illustrating an embodiment of the method of the invention.

Referring to FIG. 5, also disclosed herein are embodiments of methods of forming the structural embodiments 100, 200 and 300 of FIGS. 1, 2 and 3, respectively.

Figure 6:
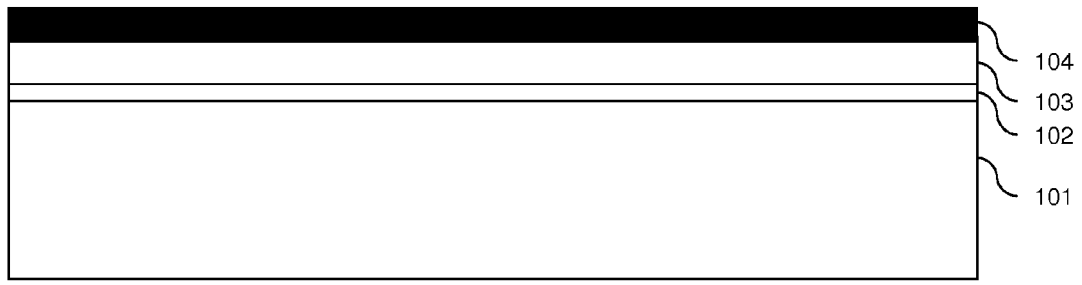
FIG. 6 is a schematic diagram illustrating a partially completed structure 100 of FIG. 1, 200 of FIG. 2 or 300 of FIG. 3.

In each embodiment of the method, a wafer (e.g., a bulk or silicon-on-insulator (SOI) wafer) is provided or formed such that the wafer comprises a substrate 101, an isolation layer 102 on the substrate 101, and a semiconductor layer 103 on the isolation layer 102 (502, see FIG. 6).

The isolation layer 102 can comprise, for example, the buried oxide layer of an SOI wafer. Alternatively, the isolation layer 102 can comprise a silicon dioxide layer, a doped silicon layer, a silicon germanium layer, etc., on a bulk wafer. For example, the wafer can comprise a bulk wafer substrate 101, an epitaxially grown silicon germanium layer 102 above the substrate 101 and an eptitaxially grown silicon layer 103 above the silicon germanium layer 102.

A cap layer 104 (e.g., an oxide layer or an oxide-nitride stack) can be formed on the semiconductor layer 103.

Figure 7A:
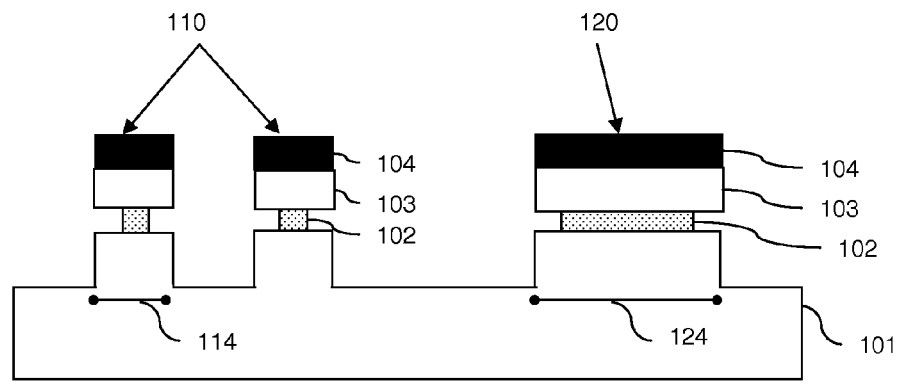
FIGS. 7a-7b are schematic diagrams illustrating a cross-section and top view, respectively, of a partially completed structure 100 of FIG. 1, 200 of FIG. 2 or 300 of FIG. 3.
Figure 7B:
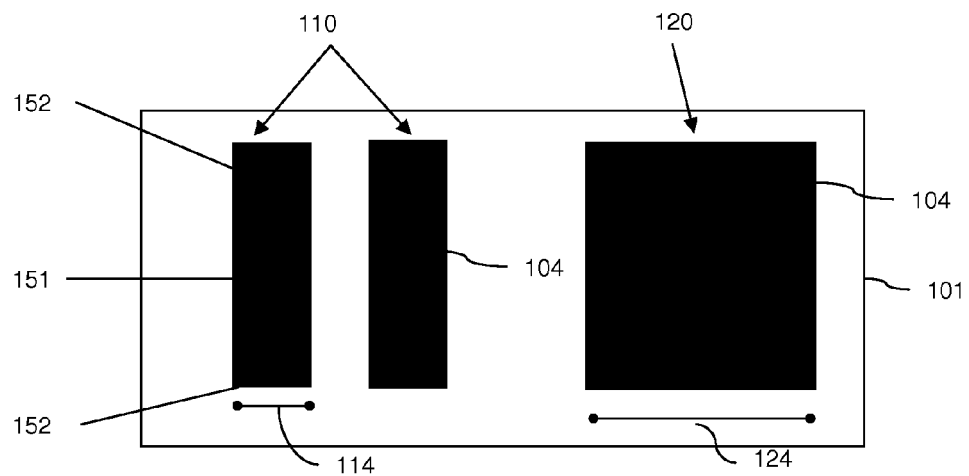

Then, using conventional lithographic techniques, a pattern is etched into the wafer through the cap layer 104 and semiconductor layer 103 to the isolation layer 102 (or, optionally, into the substrate 101) in order to form one or more first semiconductor bodies 110 for a first field effect transistor (FET) with sidewall channels and a second semiconductor body 120 for a second opposite type FET with a planar channel (504, see FIGS. 7a-7b). Each of the semiconductors bodies 110, 120 are formed with a center region 151 (i.e., a channel region) and end regions 152 (i.e., source/drain regions) on either side of the center region 151. Those skilled in the art will recognize that while the end regions 152 and center region 151 of each of the individual semiconductor bodies 110, 120 are illustrated in FIG. 7b as being formed with the same width, it is anticipated that the end regions 152 may be formed wider than the center regions 151 in order to enhance FET performance. Additionally, given that the one or more first semiconductor bodies 110 will be incorporated into a FET 191 with sidewall channels and the second semiconductor body 120 will be incorporated into a FET 192 with a planar channel, each first semiconductor body 110 may be formed with width 114 that is narrower than the width 124 of the second semiconductor body 120.

Regardless of the method embodiment used, the first FET 191 can be formed as an n-FET and the second FET 192 can be formed as a p-FET. Alternatively, the first FET 191 can be formed as a p-FET and the second FET 192 can be formed as an n-FET. Selection of which FET comprise the p-FET and with comprises the n-FET depends upon the orientation of the semiconductor on the wafer so as to optimize carrier mobility.

In each embodiment of the method, first gate electrodes 160 are formed adjacent to the first semiconductor body sidewalls 162 (512, see FIGS. 1 and 2). These first gate electrodes 160 are formed with a first conductive material (see detailed discussion below at process 306 regarding pre-selection of the gate electrode materials). The various method embodiments are distinguished by the techniques used to form the first gate electrodes and, thus, the resulting structure that is formed. Three techniques are disclosed.

Figure 8:
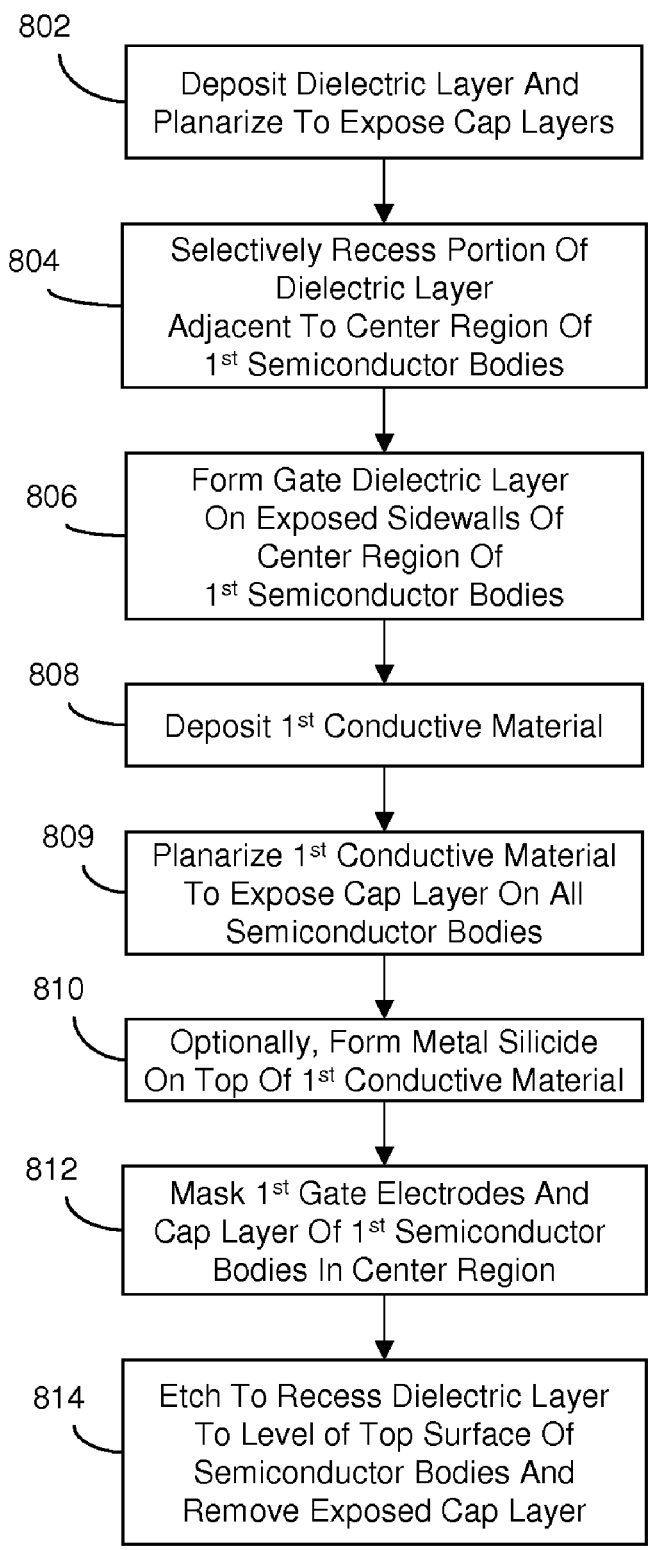
FIG. 8 is a flow diagram illustrating a technique for performing process 512 of FIG. 5.
Figure 9:
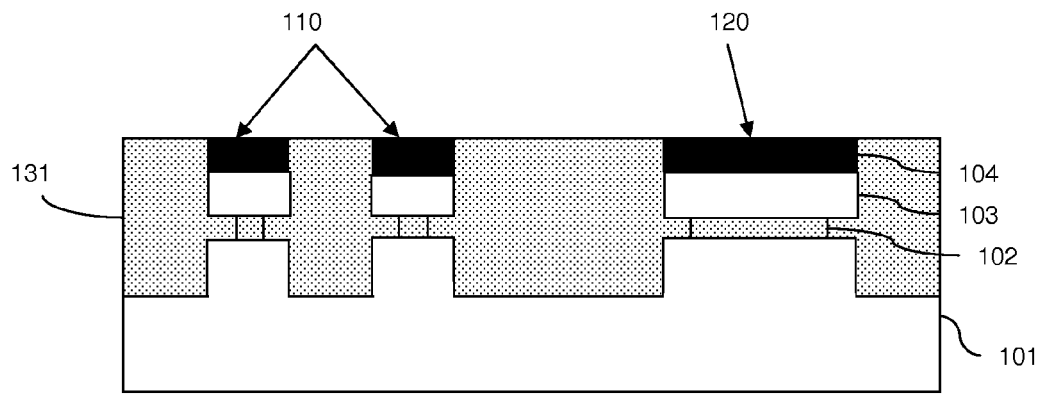
FIG. 9 is a schematic diagram illustrating a partially completed structure 100 of FIG. 1, 200 of FIG. 2 or 300 of FIG. 3.
Figure 10A:
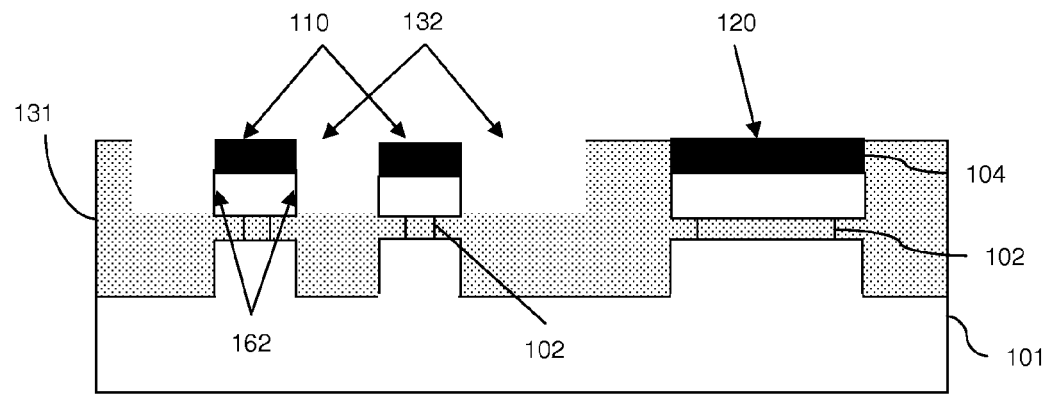
FIGS. 10a and 10b are schematic diagrams illustrating a cross-section and top view, respectively, of a partially completed structure 100 of FIG. 1.
Figure 10B:
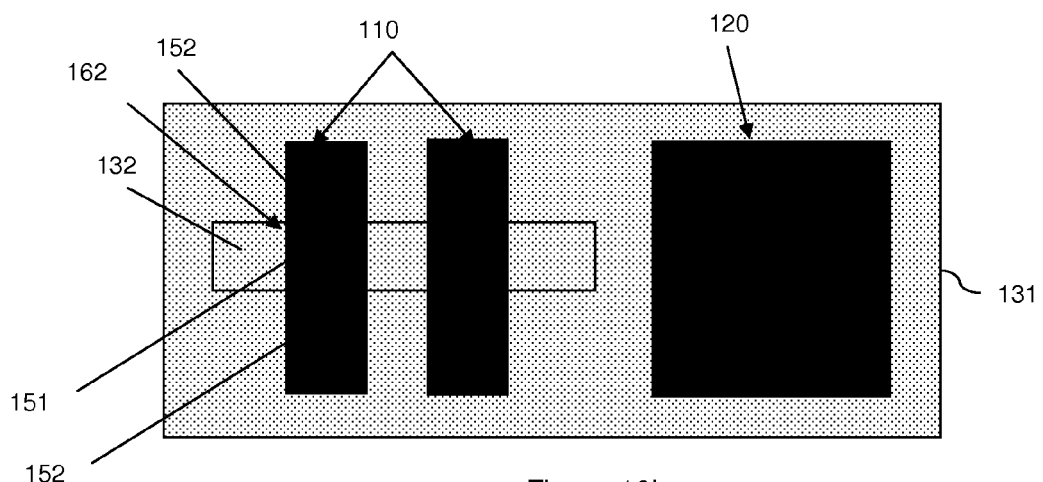

Referring to FIG. 8, one technique for forming the first gate electrodes 160, as illustrated in structure 100 of FIG. 1, comprises depositing a dielectric layer 131 over the wafer (i.e., over the first and second semiconductor bodies 110, 120) and planarizing (e.g., using chemical mechanical polishing (CMP) techniques) the dielectric layer 131 to expose the cap layer 104 of each of the semiconductor bodies 110, 120 (802, see FIG. 9). Then, a portion of the dielectric layer 131 that is adjacent to the one or more first semiconductor bodies 110 and, particularly, that is adjacent to the center region 151 of the semiconductor bodies 110, is selectively recessed, for example, to the level of the isolation layer 102 (804, see FIGS. 10a-10b). Thus, the sidewalls 162 of each first semiconductor body 110 at the center region 151 (i.e., the channel regions) are exposed, whereas the sidewalls at the end regions 152 (i.e., the source/drain regions) are protected by the dielectric layer 131. A recess 132 can be formed at process 804, for example, by using conventional lithographic patterning and etch processes.

Figure 11:
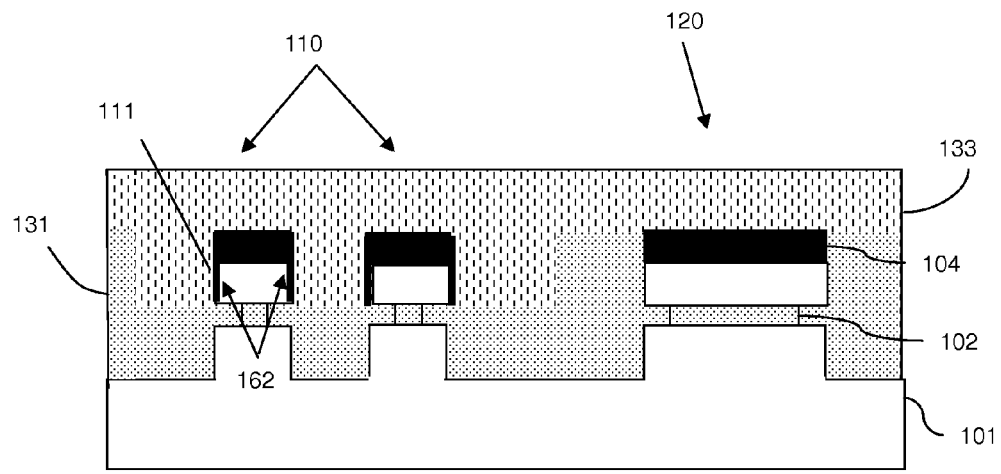
FIG. 11 is a schematic diagram illustrating a partially completed structure 100 of FIG. 1.

A sacrificial oxide layer can then be grown and stripped from the exposed first semiconductor body sidewalls 162 in recess 132 and a first gate dielectric layer 111 (e.g., a silicon dioxide layer) can be formed (e.g., grown or deposited) adjacent to the exposed first semiconductor body sidewalls 162 in recess 132 adjacent to the central channel region 151 (806, see FIG. 11).

Following gate dielectric formation at process 806, the first conductive material 133 is deposited, thereby filling in the recess 132 (i.e., filling the space adjacent to and, if applicable, between the center regions 151 of the one or more first semiconductor bodies 110) (808, see FIG. 11). The first conductive material 133 is then planarized (e.g., using CMP techniques) to again expose the cap layer 104 above each of the semiconductor bodies 110, 120, thereby forming the first gate electrodes 160 (809, see FIGS. 12a and 12b adjacent to the first semiconductor bodies 110 and not the second semiconductor body 120. Additionally, the gate electrodes 160 between multiple first semiconductor bodies 110 are shared.

Figure 12A:
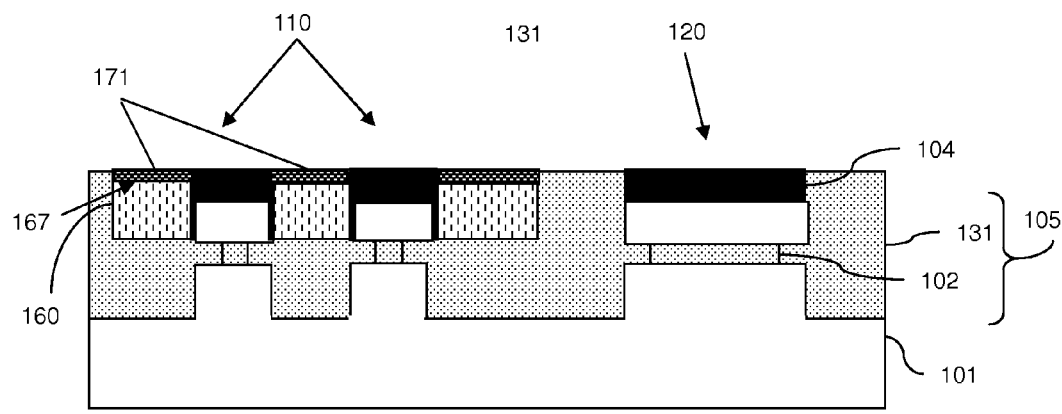
FIGS. 12a and 12b are schematic diagrams illustrating a cross-section and top view, respectively, of a partially completed structure 100 of FIG. 1.
Figure 12B:
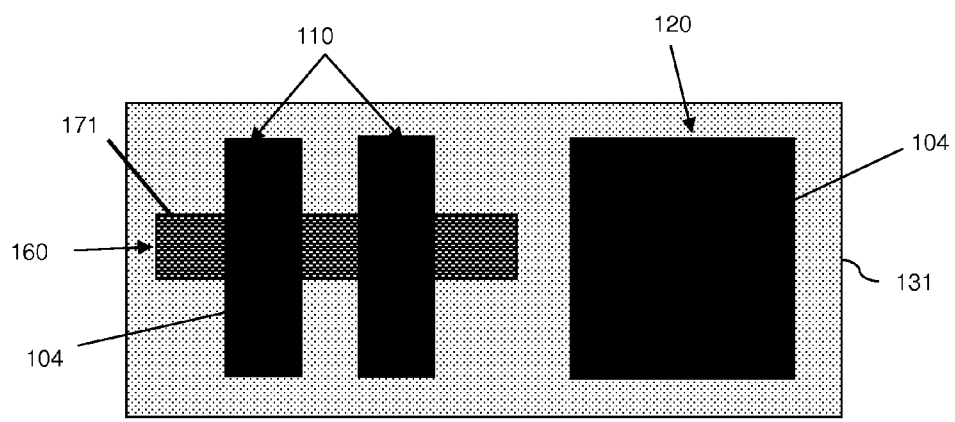

Optionally, after the first conductive material 131 is deposited and planarized, a metal silicidation process can be performed in order to form metal silicide regions 171 in the top surface 167 of the first gate electrodes 160 (810, see FIGS. 12a and 12b). For example, a self-aligned metal silicide process can be performed. That is, if the gate electrodes 160 comprise a doped semiconductor (e.g., a p- or n-doped polysilicon), then a metal (e.g., nickel (Ni), titanium (Ti), or Cobalt (Co)) can be deposited over the wafer structure and, particularly over the exposed top surface 167 of the first gate electrodes 160. The metal can then be annealed causing a reaction which forms the metal silicide at the polysilicon/metal junctions. Then, any unreacted metal is selectively removed.

Figure 13:
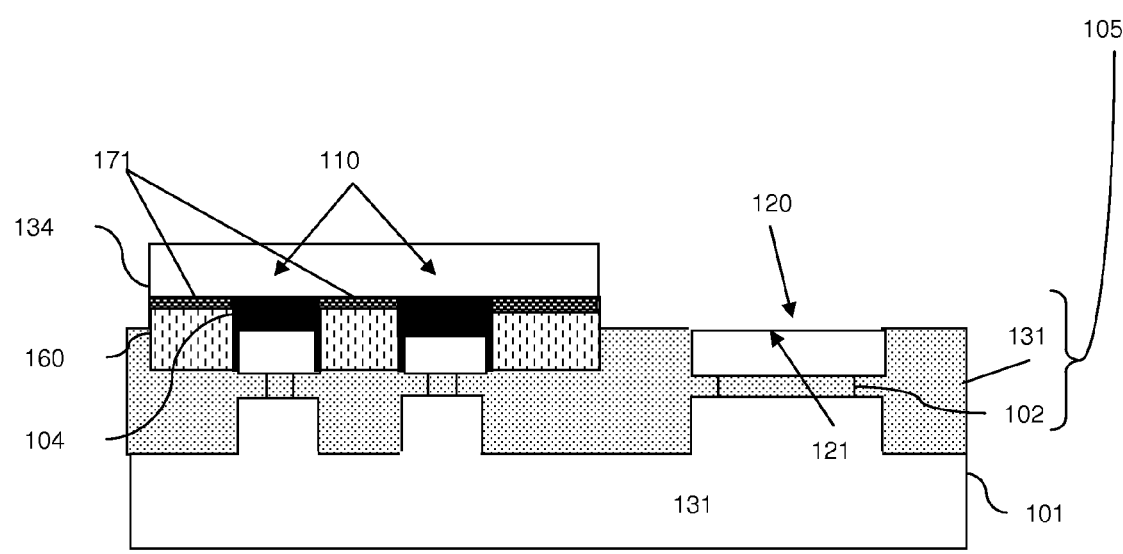
FIG. 13 is a schematic diagram illustrating a partially completed structure 100 of FIG. 1.

Following the metal silicidation process 810, a mask 134 is formed over the first gate electrodes 160 and the cap layer 104 adjacent to the center region 151 of each first semiconductor body 110 (812). Then, a multi-step etch process can be used to recess the remaining dielectric layer 131 to the level of the top surface of the semiconductor bodies and to remove the exposed cap layer 104 from above the entire second semiconductor body 120 and from above the end regions 152 of each first semiconductor body 110 (814, see FIG. 13). Then, the mask 134 is removed. Thus, following formation of the gate electrodes 160, the top surfaces of the end regions 152 of each first semiconductor body 110, the top surface 121 of the entire second semiconductor body 120 and the top surfaces of the first gate electrodes (with optional metal silicide 171) and cap layer 104 adjacent to the center region 152 of each first semiconductor body 110 are exposed. Additionally, as illustrated, the remaining portions of the isolation layer 102 and the recessed dielectric layer 131 in combination form the isolation region 105 that electrically isolates the resulting FETs 191, 192 of FIG. 1 from the substrate 101.

Figure 14:
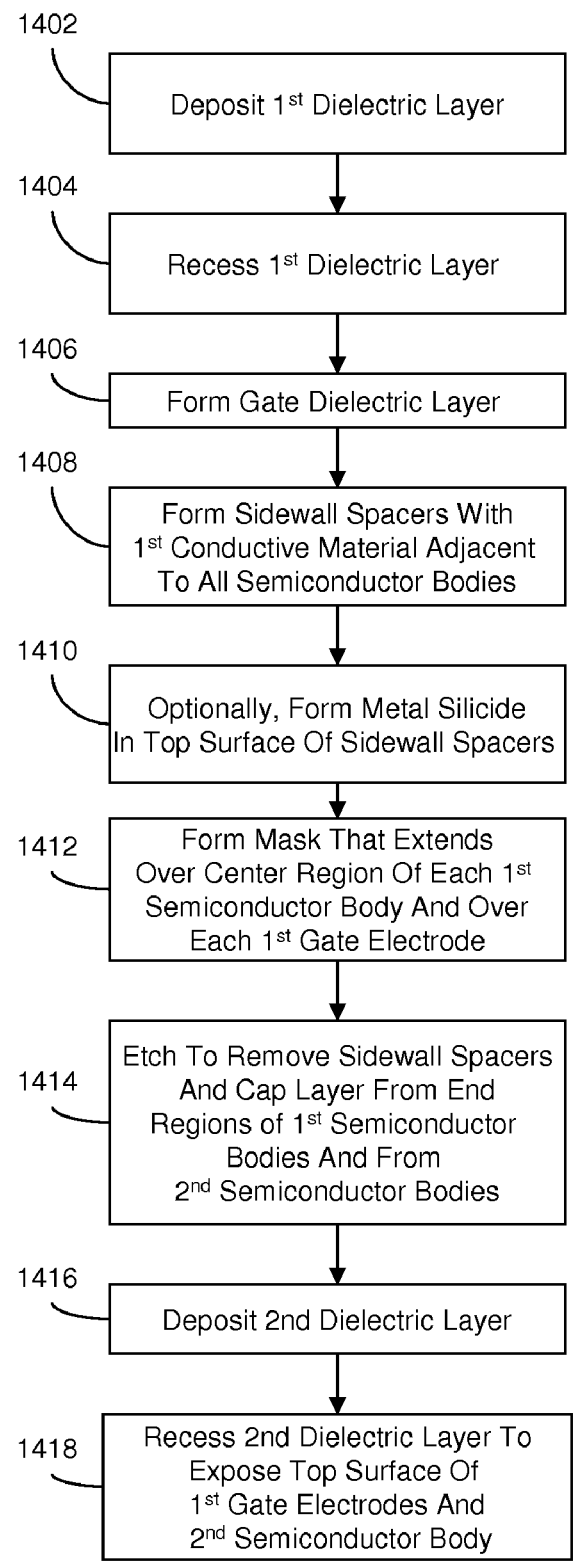
FIG. 14 is a flow diagram illustrating an alternative technique for performing process 512 of FIG. 5.
Figure 15:
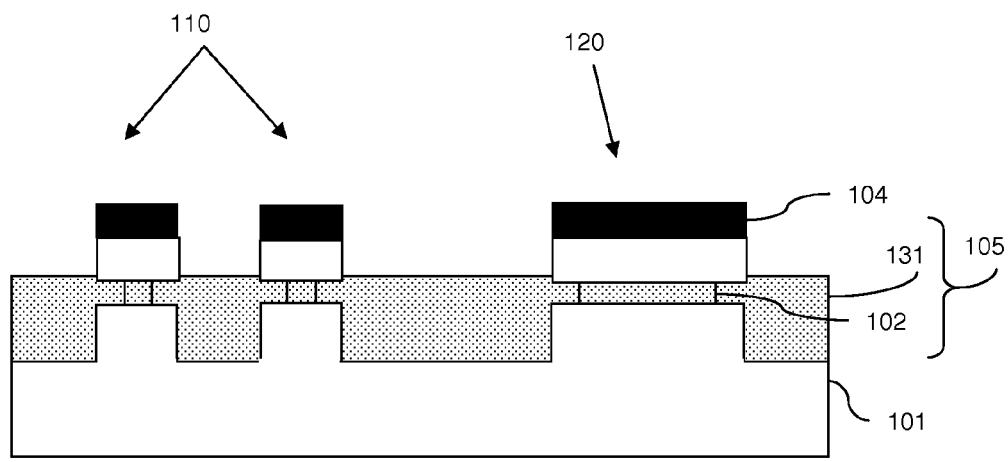
FIG. 15 is a schematic diagram illustrating a partially completed structure 200 of FIG. 2.

Referring to FIG. 14, another technique of forming the first gate electrodes 160, as illustrated in structure 200 of FIG. 2, comprises using the first conductive material to form sidewall spacers adjacent to the first semiconductor body sidewalls 162 and, particularly, adjacent to the sidewalls 162 at the center region 151 of each first semiconductor body 110. This can be accomplished by depositing a first dielectric layer 131 over the first and second semiconductor bodies 110, 120 (1402) and then, instead of recessing only a portion of the dielectric layer (as in the previously described technique), recessing the first dielectric layer 131 to approximately the level of the isolation layer 102 (1404, see FIG. 15). Thus, as illustrated, the remaining portions of the isolation layer 102 and the recessed dielectric layer 131 in combination form the isolation region 105 that electrically isolates the resulting FETs 191, 192 of FIG. 2 from the substrate 101.

After the first dielectric layer 131 is recessed at process 1404, a sacrificial oxide layer is grown on and stripped from the sidewalls of all of the semiconductor bodies. Then, a thin first gate dielectric layer 111 is formed adjacent to the sidewalls 162 of all of the semiconductor bodies 110, 120. Then, sidewall spacers that comprise the first conductive material (i.e., the first gat electrodes 160) are formed adjacent to the first gate dielectric layer 111 (1406). Thus, the first gate electrodes 160 are formed adjacent to the first semiconductor bodies 110 and not the second semiconductor body 120.

Figure 16A:
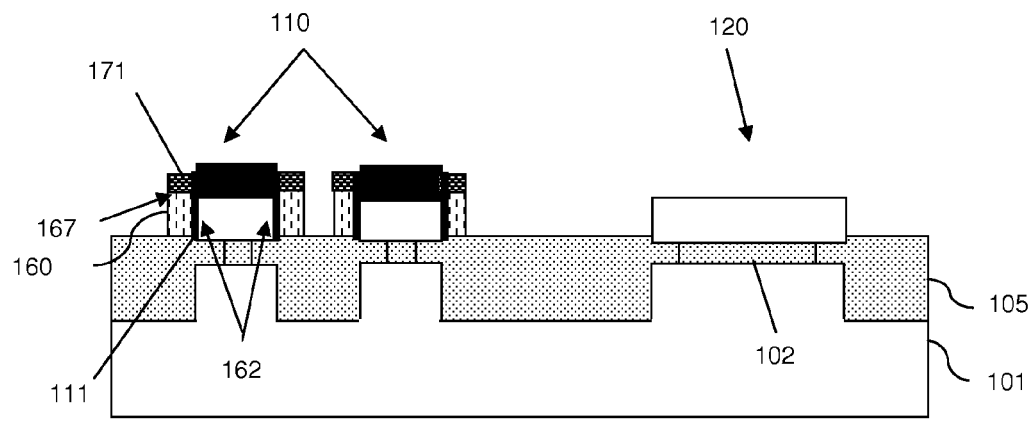
FIGS. 16a and 16b are schematic diagrams illustrating a cross-section and top view, respectively, of a partially completed structure 200 of FIG. 2.
Figure 16B:
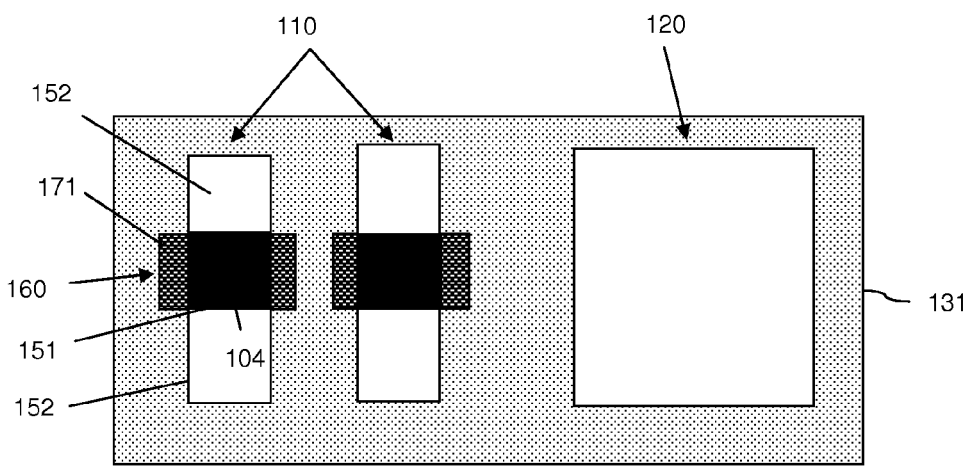

Optionally, after the sidewall spacers are formed, a metal silicidation process can be performed, as discussed above, in order to form metal silicide regions 171 in the top surface 167 of the first gate electrodes 160 (1410). Next, a mask is formed that extends over the center region 151 of each first semiconductor body 110 as well as over each first gate electrodes 160 (1412). Then, a multi-step etch process can be used to remove the cap layer 104 and conductive sidewall spacers from the end regions 152 of each first semiconductor body 110 as well as from the entire first semiconductor body 120 (1414, see FIGS. 16a-16b).

Figure 17:
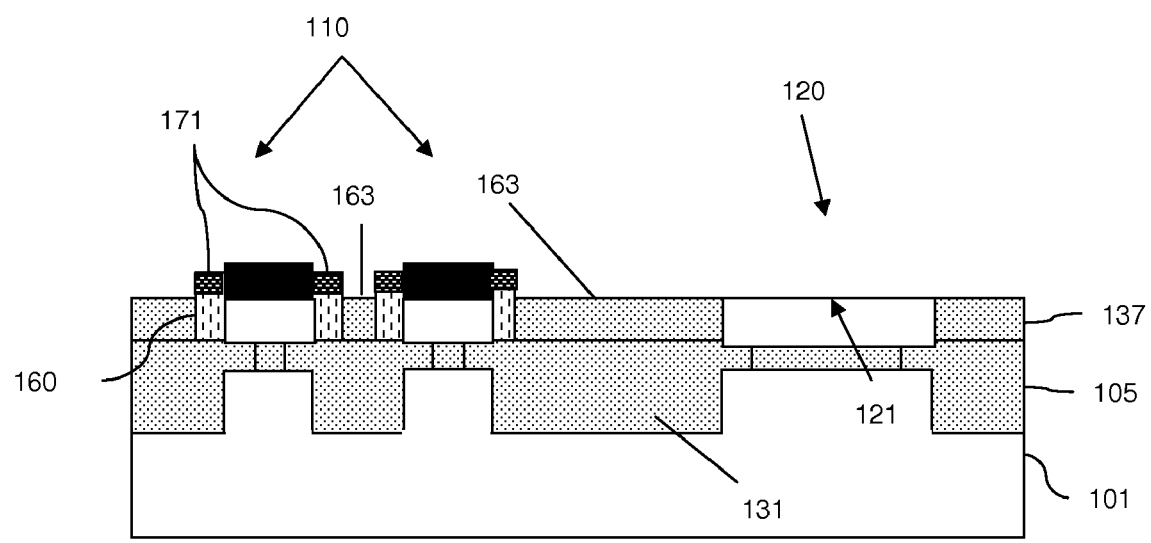
FIG. 17 is a schematic diagram illustrating a partially completed structure 200 of FIG. 2.

Following removal of the conductive sidewall spacers and cap layers from everywhere but the center region 152 of the first semiconductor bodies 110, a second dielectric layer 137 is deposited over the wafer, thereby filling the spaces around and, if applicable, between the one or more first semiconductor bodies 110 as well as the areas surrounding the second semiconductor body 120 (1416). The second dielectric layer is then recessed to expose the top surface 121 of the second semiconductor body 120 as well as to expose the first gate electrodes 160 and thereby to form isolation structures 163 adjacent to the first and second semiconductor bodies 110, 120. Thus, (418, see FIG. 17) the gate electrodes 160 between multiple first semiconductor bodies 110 are electrically isolated from each other.

Figure 18:
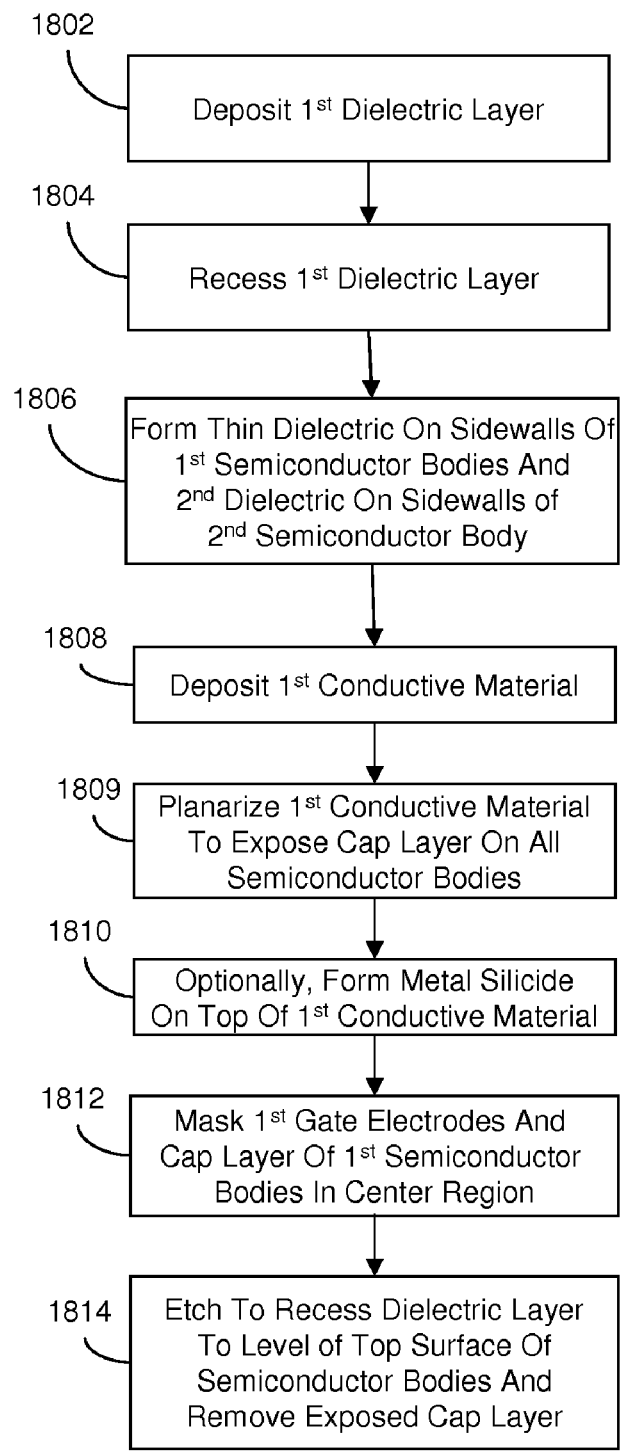
FIG. 18 is a flow diagram illustrating an alternative technique for performing process 512 of FIG. 5.
Figure 19A:
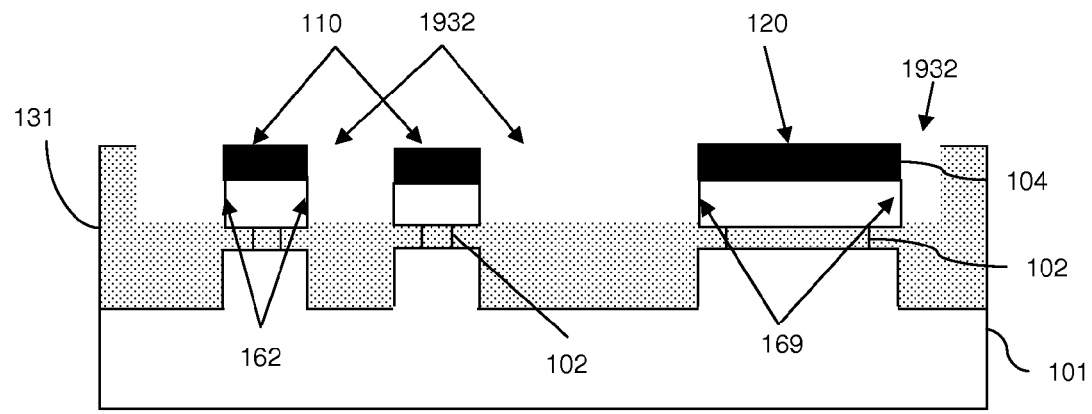
FIGS. 19a and 19b are schematic diagrams illustrating a cross-section and top view, respectively, of a partially completed structure 300 of FIG. 3.
Figure 19B:
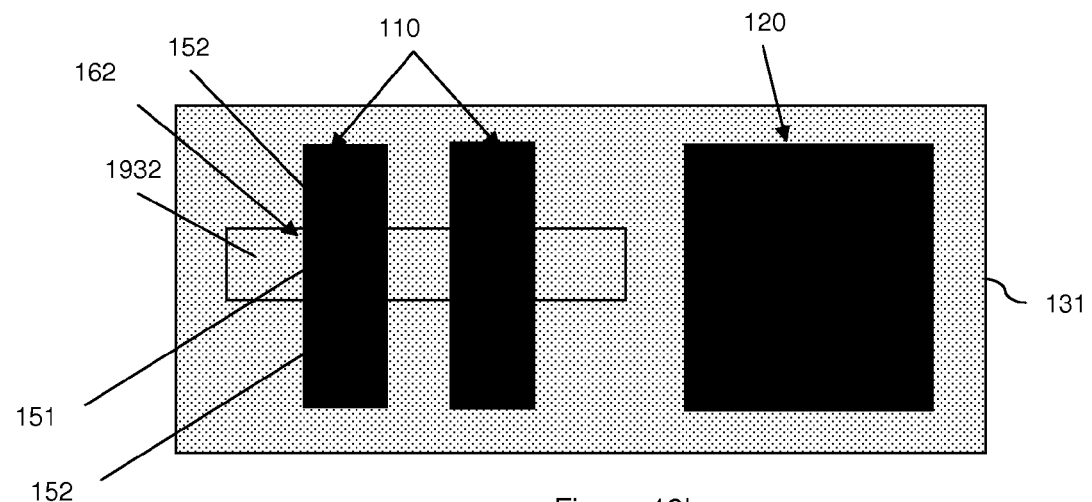

Referring to FIG. 18, one technique for forming the first gate electrodes 160, as illustrated in structure 300 of FIG. 3, comprises depositing a dielectric layer 131 over the wafer (i.e., over the first and second semiconductor bodies 110, 120) and planarizing (e.g., using chemical mechanical polishing (CMP) techniques) the dielectric layer 131 to expose the cap layer 104 of each of the semiconductor bodies 110, 120 (1802, see FIG. 9). Then, a portion of the dielectric layer 131 surrounding both the first and second semiconductor bodies 110, 120 is selectively recessed, for example, to the level of the isolation layer 102 (1804, see FIGS. 19a-b) such that the sidewalls 162 of each first semiconductor body 110 and 169 of the second semiconductor body 120 adjacent to the respective channel regions are exposed. A recess 1932 can be formed at process 1804, for example, by using conventional lithographic patterning and etching processes.

Figure 20:
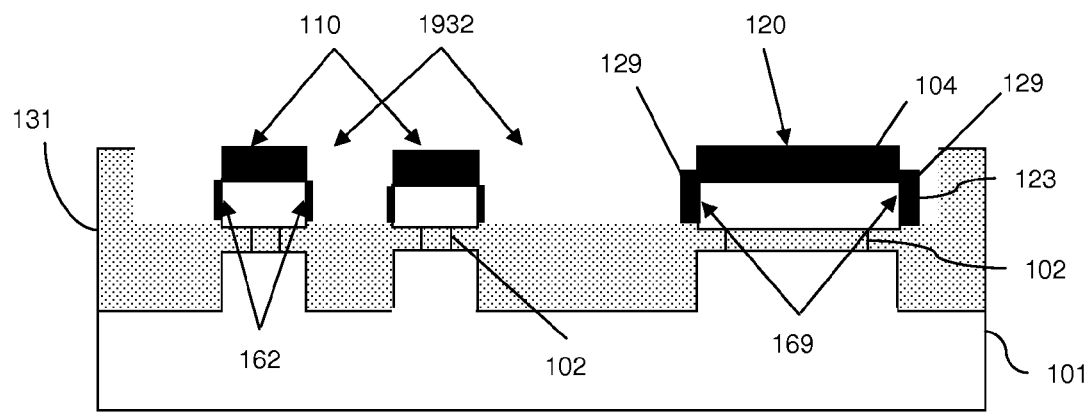
FIG. 20 is a schematic diagram illustrating a partially completed structure 300 of FIG. 3.

A sacrificial oxide layer can then be grown and stripped from the exposed sidewalls 162, 169 in recess 1932. Then, using conventional processing techniques, a dielectric material (e.g., silicon dioxide) can be formed (e.g., grown or deposited) on the exposed sidewalls 162, 169 of both the first and second semiconductor bodies 110, 120 such that the dielectric material is thicker on the second semiconductor body 120 than the first semiconductor body 110 (1806, see FIG. 20). For example, the first semiconductor bodies can be masked and a first layer of dielectric material can be grown or deposited on the sidewalls 169 of the second semiconductor body 120. Then, the mask can be removed and an additional layer of the dielectric material can be grown or deposited on the sidewalls 162 of the first semiconductor bodies and on the first layer over the second semiconductor bodies. The thinner dielectric material on the sidewalls of the first semiconductor bodies 110 can function as the first gate dielectric layer 111, whereas the thicker dielectric material on the second semiconductor body can function as isolation regions 129 that isolate the second semiconductor body 120 from the subsequently formed first gate electrode.

Figure 21:
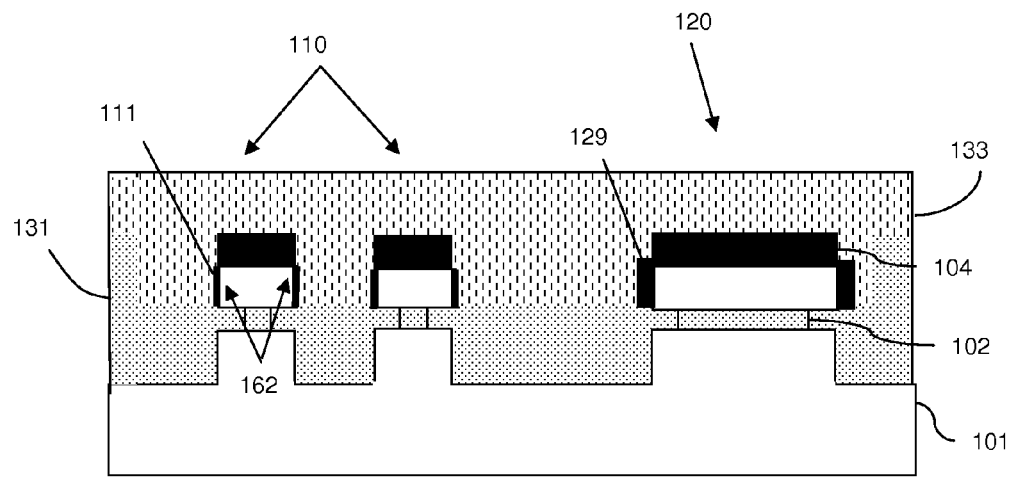
FIG. 21 is a schematic diagram illustrating a partially completed structure 300 of FIG. 3.

Then, the first conductive material 133 is deposited, thereby filling in the recess 1932 (i.e., filling the space surrounding the semiconductor bodies 110, 120) (1808, see FIG. 21). The first conductive material 133 is then planarized (e.g., using CMP techniques) to again expose the cap layer 104 above each of the semiconductor bodies 110, 120, thereby forming the first gate electrodes 160 (1809, see FIGS. 22a and 22b) that are adjacent to the both the first semiconductor bodies 110 and the second semiconductor body 120. Hence, the gate electrodes 160 between multiple first semiconductor bodies 110 are shared.

Figure 22A:
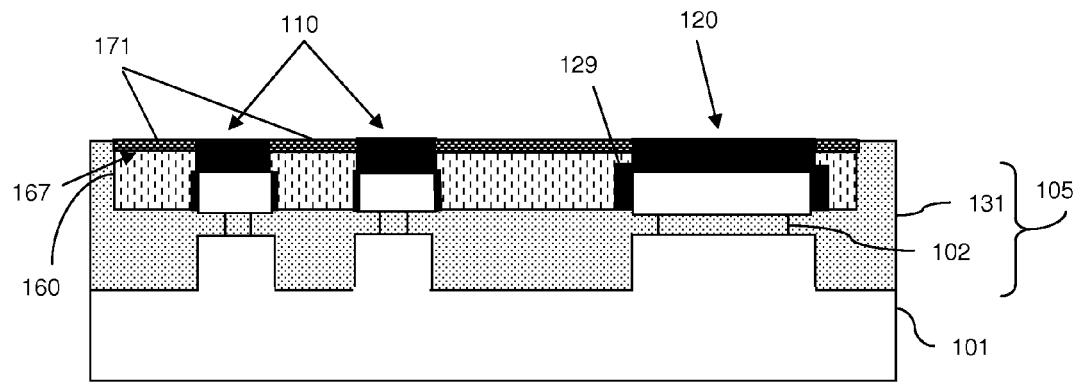
FIGS. 22a and 22b are schematic diagrams illustrating a cross-section and top view, respectively, of a partially completed structure 300 of FIG. 3.
Figure 22B:
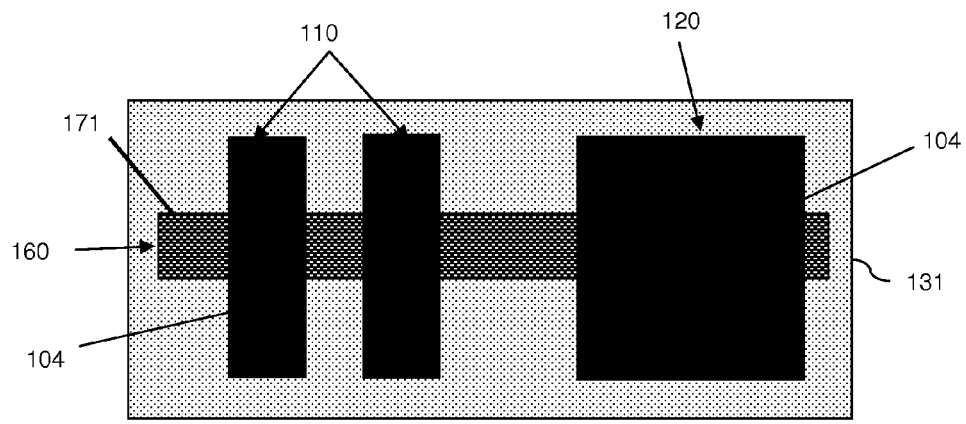

Optionally, after the first conductive material 131 is deposited and planarized, a metal silicidation process can be performed in order to form metal silicide regions 171 in the top surface 167 of the first gate electrodes 160 (1810, see FIGS. 22a and 22b). For example, a self-aligned metal silicide process can be performed. That is, if the gate electrodes 160 comprise a doped semiconductor (e.g., a p- or n-doped polysilicon), then a metal (e.g., nickel (Ni), titanium (Ti), or Cobalt (Co)) can be deposited over the wafer structure and, particularly over the exposed top surface 167 of the first gate electrodes 160. The metal can then be annealed causing a reaction which forms the metal silicide at the polysilicon/metal junctions. Then, any unreacted metal is selectively is removed.

Figure 23:
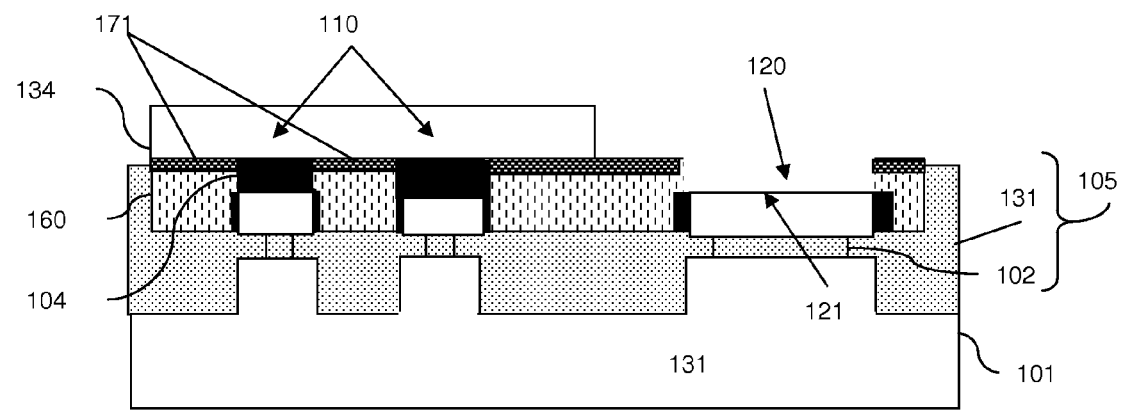
FIG. 23 is a schematic diagram illustrating a partially completed structure 300 of FIG. 3.
Figure 24:
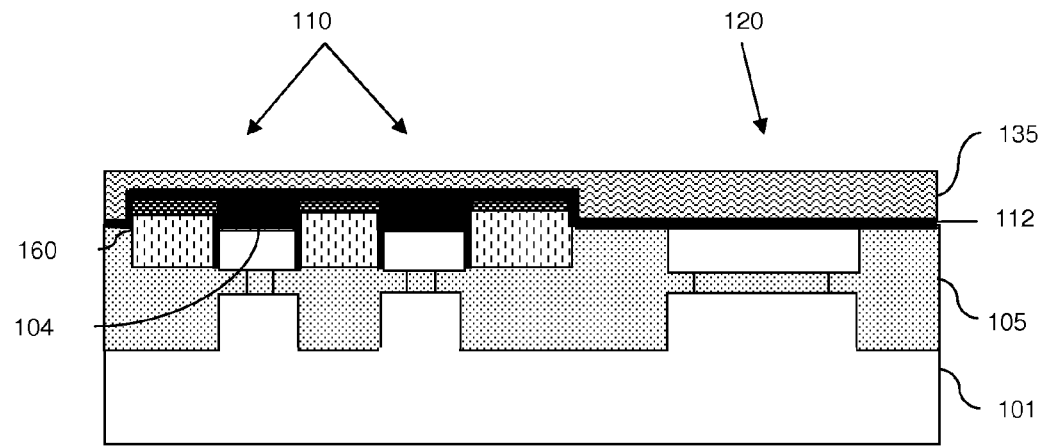
FIG. 24 is a schematic diagram illustrating a partially completed structure 100 of FIG. 1.
Figure 25A:
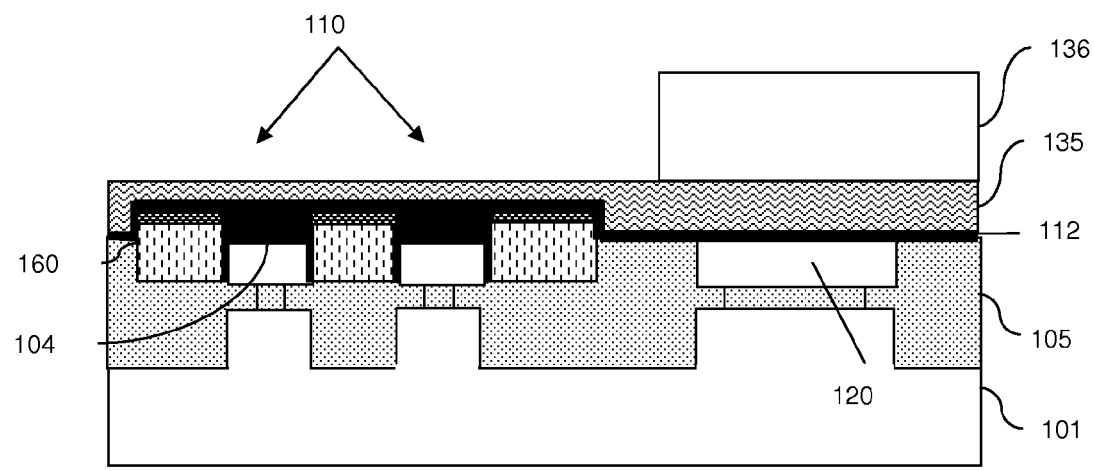
FIGS. 25a and 25b are schematic diagrams illustrating a cross-section and top view, respectively, of a partially completed structure 100 of FIG. 1.
Figure 25B:
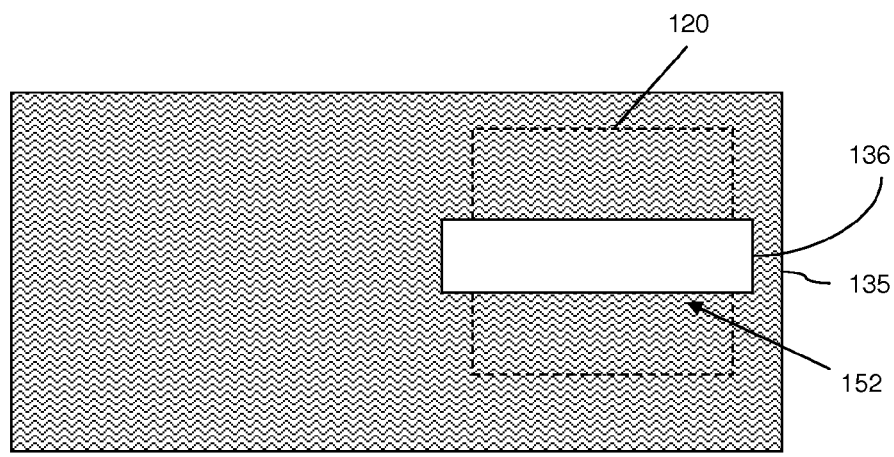
Figure 26A:
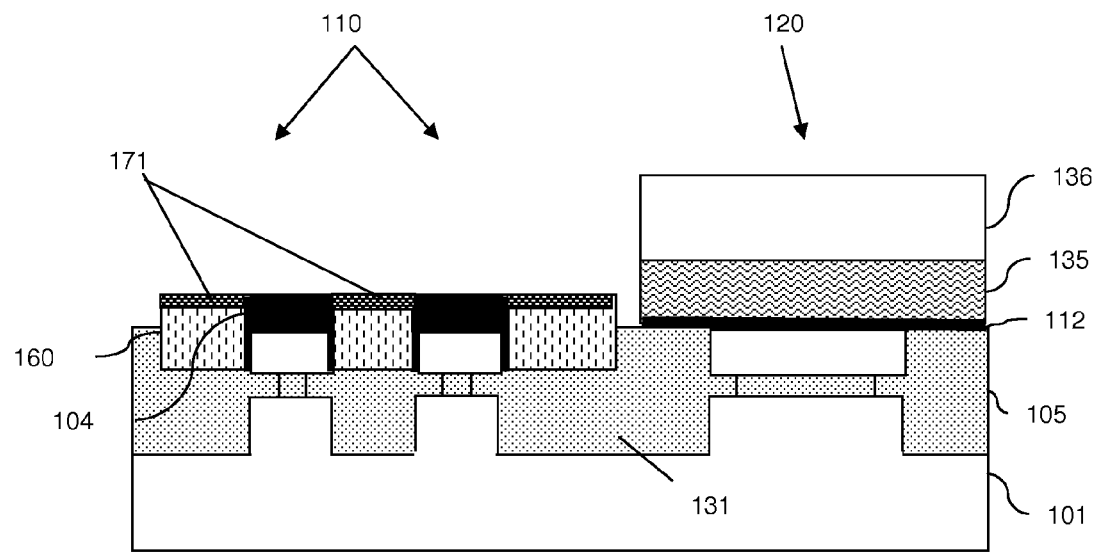
FIGS. 26a and 26b are schematic diagrams illustrating a cross-section and top view, respectively, of a partially completed structure 100 of FIG. 1.
Figure 26B:
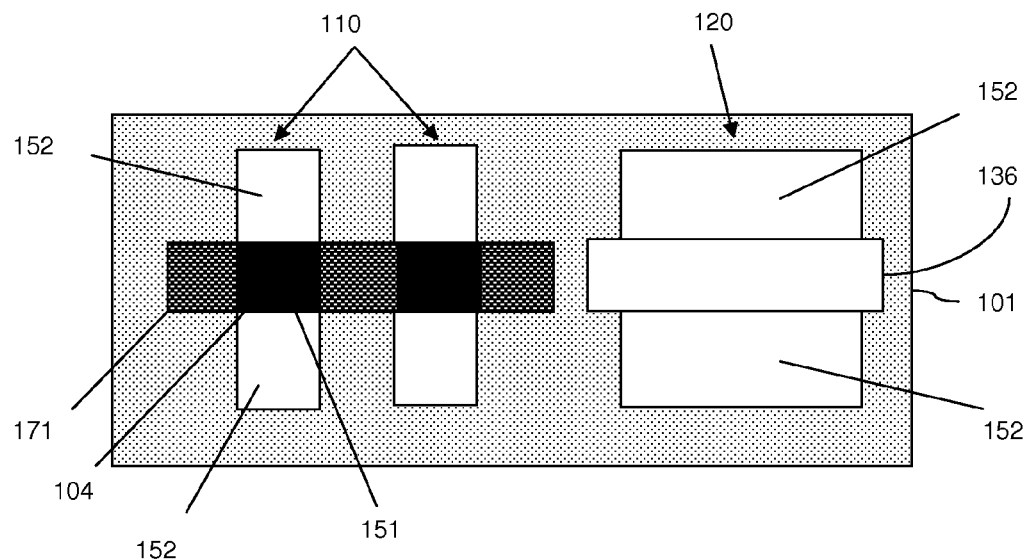

Following the metal silicidation process 1810, a mask 134 is formed over the first gate electrodes 160 and the cap layer 104 adjacent to the center region 151 of each first semiconductor body 110 (1812). Then, a multi-step etch process can be used to recess the remaining dielectric layer 131 to the level of the top surface of the semiconductor bodies and to remove the exposed cap layer 104 from above the entire second semiconductor body 120 and from above the end regions 152 of each first semiconductor body 110 (1814, see FIG. 23). Then, the mask 134 is removed. Thus, following formation of the gate electrodes 160, the top surfaces of the end regions 152 of each first semiconductor body 110, the top surface 121 of the entire second semiconductor body 120 and the top surfaces of the first gate electrodes (with optional metal silicide 171) and cap layer 104 adjacent to the center region 152 of each first semiconductor body 110 are exposed. Additionally, as illustrated, the remaining portions of the isolation layer 102 and the recessed dielectric layer 131 in combination form the isolation region 105 that electrically isolates the resulting FETs 191, 192 of FIG. 3 from the substrate 101.

Referring again to FIG. 5, after formation of the first gate electrodes 160 for the different device structures 100, 200 and 300 of FIGS. 1, 2 and 3, respectively (i.e., after process 512) by using the different techniques that are described above and illustrated in the flow diagrams of FIGS. 8, 14 and 18, the resulting structures differs only slightly. That is, a first gate electrode 160 between adjacent first semiconductor bodies 110 is shared in the device structures 100 of FIGS. 1 and 300 of FIG. 3. Whereas first gate electrodes 160 on adjacent semiconductor bodies 110 are separated by an isolation structure 163 in device structure 200 of FIG. 2. Additionally, the FETs 191 and 192 are separated by isolation regions 163 in structures 100 of FIGS. 1 and 200 of FIG. 2. However, in structure 300 of FIG. 3, the thick sidewall spacers 129 isolate the second semiconductor body 120 from the first gate electrode 160, which is located adjacent the sidewalls 162, 169 of both the first and second semiconductor bodies 110, 120, respectively. Therefore, referring again to FIG. 5, the processes 514-516 required to complete the device structures 100, 200 and 300 of FIGS. 1, 2 and 3, following formation of the first gate electrodes 160 at process 512, are essentially the same. Consequently, those skilled in the art will recognize that while the subsequent processing steps 514-516 are described and illustrated in FIGS. 24-26a-b with reference to completing the structure 100 of FIG. 1, they may also be applied to complete the structures 200 of FIGS. 2 and 300 of FIG. 3.

Following the formation of the first gate electrodes 160 at process 512, a second gate electrode 165 is formed (514, see FIGS. 1, 2, and 3). The second gate electrode 165 is formed adjacent to the top surface of the second semiconductor body 120. The second gate electrode 165 is further formed such that it extends laterally above the first FET 191 (i.e., above the center region 151 of the one or more first semiconductor bodies 110 and above the first gate electrodes 160), such that it is electrically coupled to (i.e., contacts) the first gate electrodes 160 and, optionally, such that is electrically isolated from the one or more first semiconductor bodies 110 by a cap layer 104 on top of each of the first semiconductor bodies 110.

Specifically, following the formation of the first gate electrodes 160 at process 512, a second thin gate dielectric layer 112 (e.g., a silicon dioxide layer) is formed (e.g., grown or deposited) on the wafer. Then, a blanket layer of the second conductive material 135 is deposited onto the second gate dielectric layer 112 (see FIG. 24). A mask 136 is formed on the conductive material 135 over an area corresponding to the center region 151 of the second semiconductor body 120 (see FIGS. 25a and 25b). The second gate dielectric layer 112 and the second conductive material 135 are then selectively etched off the wafer except below the mask 136, thereby exposing the first gate electrodes 160 (with optional metal silicide regions 171), the cap layer 104 over the center region 151 of each first semiconductor body 110 and the end regions 152 of both the first and second semiconductor bodies 110, 120 (see FIGS. 26a and 26b). Then, the second conductive material 135 is again deposited, etched (e.g., using conventional lithographic patterning techniques) to form the second gate electrode 165 such that it extends over the center regions 151 of each of the semiconductor bodies 110, 120 (see FIG. 4).

Described above are techniques that may be used to form the first and second gate electrodes 160, 165 of device structure 100 of FIG. 1, 200 of FIG. 2, or 300 of FIG. 3 at process 512-514. However, prior to formation of the first and second gate electrodes 160, 165, the first conductive material that is used to form the one or more first gate electrodes 160 and the second conductive material that is used to form the second gate electrode 165 must be pre-selected (506). Specifically, the material used to form the first and second gate electrodes vary depending upon which of the first and second FETs 191, 192 is a p-FET and which is an n-FET. That is, a p-FET can be formed with a gate electrode material that is pre-selected to have a work function near the valence band (508). For example, the p-FET gate electrode material can comprise a valence band metal (e.g., magnesium (Mg)) or polysilicon heavily doped with a p-type dopant (e.g., boron (B)). Whereas, an n-FET can be formed with a gate electrode material that is pre-selected to have a work function near the conduction band (510). For example, the n-FET gate electrode material can comprise a conduction band metal (e.g., aluminum (Al)) or polysilicon heavily doped with an n-type dopant (e.g., phosphorus (P), antimony (Sb) or arsenic (As)).

Note that unless a metal silicide region 171 is formed on the top surfaces of the one or more first semiconductor bodies 110 (e.g., at process 810 of FIG. 8, process 1410 of FIG. 14, or 1810 of FIG. 18 described above), a pn-junction diode may be created at the interface between the first and second gate electrodes. For example, a pn-junction diode will be created if the materials selected for the first and second gate electrodes include both a p-doped polysilicon and an n-doped polysilicon. However, the metal silicide regions 171 will form bridges between the first and second gate electrodes in order to ensure that current is allowed to flow freely.

Following the formation of the second gate electrode 165 at process 514, additional FET processing (e.g., spacer formation, halo implantation, extension implantation, source/drain region implantation, contact formation, etc.) may be performed (516) in order to complete the FET structures 100 of FIG. 1, 200 of FIG. 2 and 300 of FIG. 3, according to design requirements.

In view of the foregoing disclosed herein are embodiments of a dual-plane high-mobility complementary metal oxide semiconductor (CMOS) device that has a first field effect transistor (FET) with sidewall channels and a second opposite type FET with a planar channel. The first FET can be a p-type FET (i.e., a p-FET) and the second FET can be an n-type FET (i.e., an n-FET) or vice versa, depending upon semiconductor orientation. The conductive material used to form the gate electrodes of each of the different type FETs is different and is pre-selected to optimize FET performance. For example, the gate electrode material for a p-FET is pre-selected to have a work function near the valence band and the gate electrode material for an n-FET is pre-selected to have a work function near the conduction band. The first gate electrodes are located adjacent to the sidewall channels of the first FET and the second gate electrode is located above the planar channel of the second FET. However, the device structure is unique in that the second gate electrode extends laterally above the first FET and is electrically coupled to the first gate electrodes. Also disclosed is an associated method of forming the CMOS device. By use of this invention improved circuit density can be achieved. This, in turn, results in shorter wires and lower interconnect capacitances. As a result, circuits which employ this invention enjoy reduced switching power and increased switching.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention described herein can be practiced with modification within the spirit and scope of the appended claims.

What is claimed is:

1. A method of forming a complementary metal oxide semiconductor (CMOS) device, comprising:

providing a wafer comprising a substrate, an isolation layer on said substrate, and a semiconductor layer on said isolation layer;

etching said wafer through said semiconductor layer in order to form at least one first semiconductor body for an n-type field effect transistor and a second semiconductor body for a p-type field effect transistor;

forming first gate electrodes adjacent to sidewalls of said at least one first semiconductor body, wherein said first gate electrodes are formed with a first conductive material; and forming a second gate electrode adjacent to a top surface of said second semiconductor body such that said second gate electrode extends laterally above said at least one first semiconductor body and is electrically coupled to said first gate electrodes, wherein said second gate electrode is formed with a second conductive material that is different from said first conductive material.

2. The method of forming a CMOS device according to claim 1, wherein said forming of said first gate electrodes with said first conductive material comprises forming said first gate electrodes with one of a conduction band metal and an n-doped polysilicon and wherein said forming of said second gate electrode with said second conductive material comprises forming said second gate electrode with one of a valence band metal and a p-doped polysilicon.

3. The method of forming a CMOS device according to claim 1, further comprising, before said forming of said second gate electrode, forming metal silicide regions on top of said first gate electrodes.

4. The method of forming a CMOS device according to claim 1, wherein said forming of said first gate electrodes comprises:

depositing a dielectric layer;

forming a recess in said dielectric layer such that said sidewalls of said at least one first semiconductor bodies are exposed at a center region; and depositing said first conductive material into said recess.

5. The method of forming a CMOS device according to claim 1, wherein said forming of said first gate electrodes comprises forming, adjacent to said sidewalls at a center region of said at least one first semiconductor bodies, sidewall spacers comprising said first conductive material.

6. A method of forming a complementary metal oxide semiconductor (CMOS) device, comprising:

providing a wafer comprising a substrate, an isolation layer on said substrate, and a semiconductor layer on said isolation layer;

etching said wafer through said semiconductor layer in order to form at least one first semiconductor body for a p-type field effect transistor and a second semiconductor body for an n-type field effect transistor;

forming first gate electrodes adjacent to sidewalls of said at least one first semiconductor body, wherein said first gate electrodes are formed with a first conductive material; and forming a second gate electrode adjacent to a top surface of said second semiconductor body such that said second gate electrode extends laterally above said at least one first semiconductor body and is electrically coupled to said first gate electrodes, wherein said second gate electrode is formed with a second conductive material that is different from said first conductive material.

7. The method of forming a CMOS device according to claim 6, wherein said forming of said first gate electrode with said first conductive material comprises forming said first gate electrodes with one of a valence band metal and a p-doped polysilicon and wherein said forming of said second gate electrode with said second conductive material comprises forming said second gate electrode with one of a conduction band metal and an n-doped polysilicon.

8. The method of forming a CMOS device according to claim 6, further comprising, before said forming of said second gate electrode, forming metal silicide regions on top of said first gate electrodes.

9. The method of forming a CMOS device according to claim 6, wherein said forming of said first gate electrodes comprises:

depositing a dielectric layer;

forming a recess in said dielectric layer such that said sidewalls of said at least one first semiconductor bodies are exposed at a center region; and depositing said first conductive material into said recess.

10. The method of forming a CMOS device according to claim 6, wherein said forming of said first gate electrodes comprises forming, adjacent to said sidewalls at a center region of said at least one first semiconductor bodies, sidewall spacers comprising said first conductive material.

11. A method of forming a complementary metal oxide semiconductor (CMOS) device, comprising:

providing a wafer comprising a substrate, an isolation layer on said substrate, and a semiconductor layer on said isolation layer;

etching said wafer through said semiconductor layer in order to form at least one first semiconductor body for an n-type field effect transistor and a second semiconductor body for a p-type field effect transistor;

forming first gate electrodes adjacent to sidewalls of said at least one first semiconductor body, wherein said first gate electrodes are formed with a first conductive material;

forming a second gate electrode adjacent to a top surface of said second semiconductor body such that said second gate electrode extends laterally above said at least one first semiconductor body and is electrically coupled to said first gate electrodes, wherein said second gate electrode is formed with a second conductive material that is different from said first conductive material; and forming an isolation region on said insulator layer positioned between a first gate electrode of said n-type field effect transistor and a second opposing sidewall of said p-type field effect transistor.

12. The method of forming a CMOS device according to claim 11, wherein said forming of said first gate electrodes with said first conductive material comprises forming said first gate electrodes with one of a conduction band metal and an n-doped polysilicon and wherein said forming of said second gate electrode with said second conductive material comprises forming said second gate electrode with one of a valence band metal and a p-doped polysilicon.

13. The method of forming a CMOS device according to claim 11, further comprising, before said forming of said second gate electrode, forming metal silicide regions on top of said first gate electrodes.

14. The method of forming a CMOS device according to claim 11, wherein said forming of said first gate electrodes comprises:

depositing a dielectric layer;

forming a recess in said dielectric layer such that said sidewalls of said at least one first semiconductor bodies are exposed at a center region; and depositing said first conductive material into said recess.

15. The method of forming a CMOS device according to claim 11, wherein said forming of said first gate electrodes comprises forming, adjacent to said sidewalls at a center region of said at least one first semiconductor bodies, sidewall spacers comprising said first conductive material.

* * * * *